US009860997B2

(12) United States Patent
Shin et al.

(10) Patent No.: US 9,860,997 B2
(45) Date of Patent: Jan. 2, 2018

(54) IMAGE DISPLAY DEVICE

(71) Applicant: LG ELECTRONICS INC., Seoul (KR)

(72) Inventors: Donghyok Shin, Seoul (KR); Bumgi Min, Seoul (KR); Sangdon Park, Seoul (KR); Sungjin Eun, Seoul (KR); Namhyeon Choi, Seoul (KR); Wansik Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 79 days.

(21) Appl. No.: 14/901,312

(22) PCT Filed: Jan. 14, 2014

(86) PCT No.: PCT/KR2014/000402
§ 371 (c)(1),
(2) Date: Dec. 28, 2015

(87) PCT Pub. No.: WO2014/208854
PCT Pub. Date: Dec. 31, 2014

(65) Prior Publication Data
US 2016/0353587 A1    Dec. 1, 2016

(30) Foreign Application Priority Data

Jun. 26, 2013    (KR) .......................... 10-2013-0073882

(51) Int. Cl.
*G06F 1/16* (2006.01)
*H05K 5/02* (2006.01)
(Continued)

(52) U.S. Cl.
CPC ......... *H05K 5/0017* (2013.01); *G06F 1/1601* (2013.01); *G06F 1/1616* (2013.01);
(Continued)

(58) Field of Classification Search
CPC .... G06F 1/1616; G06F 1/1624; G06F 1/1681; G06F 1/1656; G06F 1/1626;
(Continued)

(56) References Cited

U.S. PATENT DOCUMENTS 7,756,554 B2 *    7/2010    Jung ................... H04M 1/0216
                                                                455/566
2004/0012918 A1 *    1/2004    Chen ..................... G06F 1/1616
                                                                361/679.11
(Continued)

FOREIGN PATENT DOCUMENTS

JP    2009-290839 A    12/2009
JP    2012-502321 A    1/2012
(Continued)

OTHER PUBLICATIONS

International Search Report and Written Opinion dated May 8, 2014 issued in Application No. PCT/KR2014/000402.

*Primary Examiner* — Adam B Dravininkas
(74) *Attorney, Agent, or Firm* — KED & Associates, LLP

(57) ABSTRACT

Provided is an image display device including: a first case that is formed to support a display unit; a second case that is formed to cover a rear surface of a middle case; and a coupling module that couples the first case and the second case to each other, in which the coupling module includes a first member that is formed on the rear surface and has a predetermined length, a second member that is formed on one surface of the second case that faces the rear surface and is formed in parallel with the first member, and a slide member that is formed in such a manner that the slide member is inserted and is able to be moved in a sliding way.

18 Claims, 14 Drawing Sheets

(51) Int. Cl.
*H05K 5/00* (2006.01)
*H04N 5/64* (2006.01)
*H05K 7/20* (2006.01)

(52) U.S. Cl.
CPC .............. *G06F 1/1624* (2013.01); *H04N 5/64* (2013.01); *H05K 5/0217* (2013.01); *H05K 7/20963* (2013.01)

(58) Field of Classification Search
CPC ................. G06F 1/1679; G06F 1/1601; H01L 2224/48091; H01L 21/67775; H05K 5/0226; H05K 1/028; H05K 5/0221; H05K 7/1461; H05K 5/0017; H05K 7/20963; H05K 5/0217; H04N 5/64
See application file for complete search history.

(56) References Cited

U.S. PATENT DOCUMENTS

| | | | | |
|---|---|---|---|---|
| 2004/0085718 A1* | 5/2004 | Imsand | ..................... | G06F 1/16 361/679.04 |
| 2005/0122669 A1* | 6/2005 | Lee | ..................... | H04M 1/0237 361/679.01 |
| 2006/0120029 A1* | 6/2006 | Ryu | ..................... | G06F 1/1624 361/679.09 |
| 2007/0006421 A1* | 1/2007 | Park | ..................... | H04M 1/0237 16/334 |
| 2008/0230437 A1* | 9/2008 | Ou | ..................... | G06F 1/1616 206/701 |
| 2008/0304215 A1* | 12/2008 | Chiu | ..................... | G06F 1/1616 361/679.27 |
| 2009/0090825 A1* | 4/2009 | Jung | ..................... | G06F 1/1601 248/205.1 |
| 2009/0159767 A1* | 6/2009 | Ko | ..................... | G06F 1/1624 248/274.1 |
| 2010/0053877 A1* | 3/2010 | Hsu | ..................... | G06F 1/1616 361/679.27 |
| 2010/0124003 A1* | 5/2010 | Liu | ..................... | G06F 1/1626 361/679.01 |
| 2010/0259881 A1* | 10/2010 | Choi | ..................... | G06F 1/1601 361/679.21 |

FOREIGN PATENT DOCUMENTS

| KR | 10-2002-0034664 A | 5/2002 |
|---|---|---|
| KR | 10-2010-0090847 A | 8/2010 |
| KR | 10-2013-0065979 A | 6/2013 |

* cited by examiner

IMAGE DISPLAY DEVICE

CROSS-REFERENCE TO RELATED PATENT APPLICATIONS

This application is a U.S. National Stage Application under 35 U.S.C. §371 of PCT Application No. PCT/KR2014/000402, filed Jan. 14, 2014, which claims priority to Korean Patent Application No. 10-2013-0073882, filed Jun. 26, 2013, whose entire disclosures are hereby incorporated by reference.

TECHNICAL FIELD

The present invention relates to a case that constitutes an external appearance of an image display device.

BACKGROUND ART

Image display devices include an apparatus that receives and displays broadcasting signals or records and reproduces a moving image, and an apparatus that records and reproduces audio. Such image display devices include a television set, a computer monitor, a projector, a tablet PC, and the like.

With the tendency of the image display devices to employ multiple functions, the image display devices have been realized in the form of a multimedia player that is equipped with complex functions including photographing, video shooting, and gaming, as wells as receiving broadcast and playing audio and video files. Furthermore, the image display devices have been realized as smart apparatuses (for example, a smart television).

Structural and software modifications to the image display device are considered for supporting and improving complex functions that are performed by the image display device.

Particularly, a case of the video display that constitutes an external appearance of the image display device by coupling a front case and a rear case to each other.

A method is considered in which the use of such a case provides a user of the image display device with user convenience and the external appearance of the image display apparatus is made more appealing.

DISCLOSURE OF THE INVENTION

Therefore, an object of the present invention is to provide an image display device that has a type of external appearance different from that in the related art.

Another object of the present invention is to provide an image display device that has a more appealing external appearance that results from coupling cases to each other using a slide member and thus from minimizing the number of screws that are used.

To achieve these and other advantages and in accordance with the purpose of the present invention, as embodied and broadly described herein, there is provided an image display device including: a first case that is formed to support a display unit; a second case that is formed to cover a rear surface of the first case; and a coupling module that couples the first case and the second case to each other, in which the coupling module includes a first member that is formed on the rear surface and has a predetermined length, a second member that is formed on one surface of the second case that faces the rear surface and is formed in parallel with the first member, and a slide member that is formed in such a manner that the slide member is inserted and is able to be moved in a sliding way.

In the image display device, the first and second members may be arranged on the first and second cases, respectively, in such a manner as to have different heights from the rear surface.

In the image display device, the slide member may include first and second insertion portions that are inserted into the first and second members, respectively, and a curved portion that is formed to couple the first and second insertion portions that are inserted in the first and second members, respectively, at different height.

In the image display device, protrusions that protrude in a direction that intersects a direction in which the first and second insertion portions are inserted on the first and second members, respectively, and the first and second members may have guide portions that correspond to the protrusions, respectively.

In the image display device, a width of the slide member may increase gradually.

In the image display device, a fixation portion that is elastically transformed and is coupled to at least one among the first and second members may be formed on a lower portion of the slide member.

In the image display device, the second case may include an opening portion that is formed in a state where the slide member comes in and goes out through the opening portion, in order to fix the first and second cases by moving the slide member from one end of each of the first and second cases to the opposite end in a state where the first and second cases are brought to come into contact with each other.

In the image display device, a heat generation portion may be exposed to the outside on a rear surface of the first case, and the coupling module may be arranged adjacent to the heat generation portion.

In the image display device, the coupling module may include a heat conduction portion, and the heat conduction portion may extend from the heat generation portion to the opening portion.

In the image display device, a chamfer portion may be formed on one surface of each of the first and second members, which is adjacent to the opening portion.

In the image display device, the second case may be formed in such a manner as to cover all portions of a rear surface of the image display device.

In the image display device, the second case may be formed to be curved to a predetermined curvature, in such a manner that, as the second case goes farther from a main surface of the second case to edge portions, a distance to the first case becomes shorter.

In the image display device, a shock-absorbing may be formed between the slide member and the second member in order to prevent vibration from propagating from the first case.

To achieve these and other advantages and in accordance with the purpose of the present invention, as embodied and broadly described herein, there is provided an image display device including: a first case; a second case; and a coupling module that couples the first and second cases to each other, in which the coupling module includes first and second members that are formed on surfaces of the first and second cases, respectively, which face each other, in order to fix the first and second cases by moving a slide member from one end of each of the first and second cases to the opposite end in a state where the first and second cases are brought to come into contact with each other.

In the image display device, the first member may include a first groove portion that is formed to have a predetermined length, the second member may include a second groove portion that is formed in parallel with the first groove portion, and both flank sides of the slide member may be inserted into the first and second groove portions, respectively, and thus the slide member may be moved along the first and second groove portions.

An image display device according to at least one embodiment of the present invention realizes a distinctive appearance and enhances a sense of beauty. Thus, the image display device that has a high-quality external appearance is provided.

MODES FOR CARRYING OUT THE PREFERRED EMBODIMENTS

Figure 1:
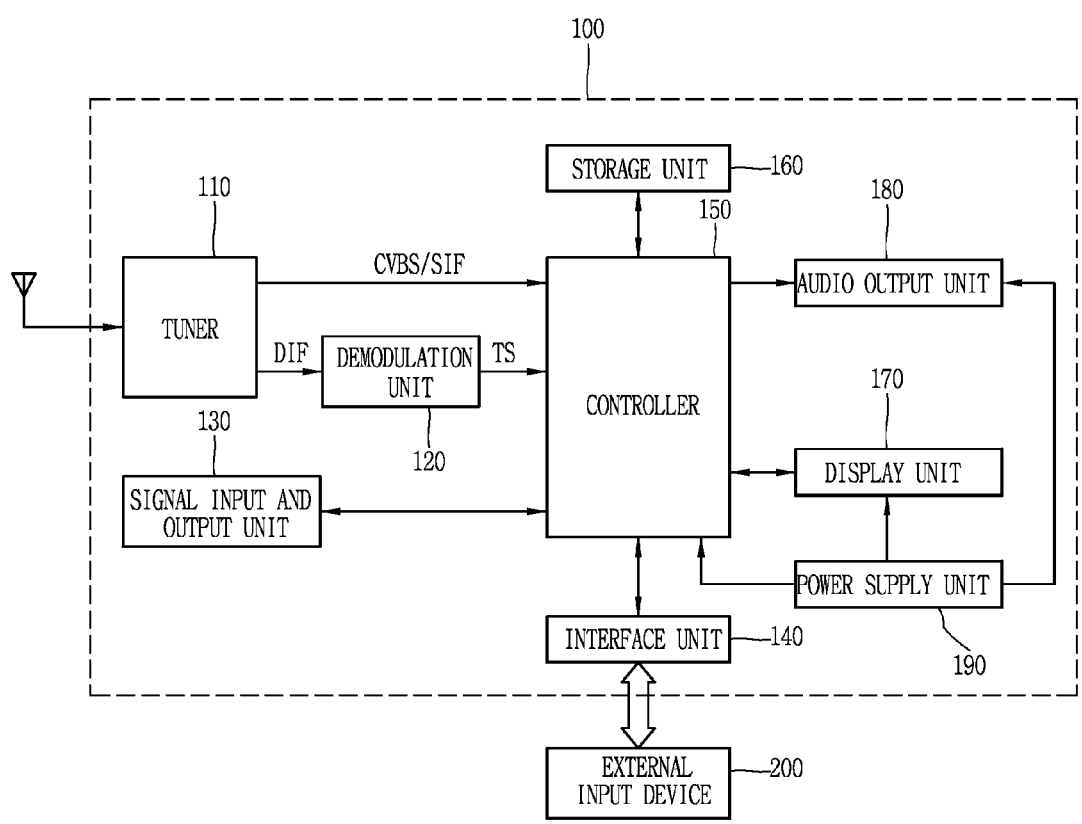
FIG. 1 is a block diagram illustrating an image display device according to the present invention and an external input device.

Reference will now be made in detail to the preferred embodiments of the present invention, examples of which are illustrated in the accompanying drawings.

Referring to the accompanying drawings, embodiments according to the present invention will be described in detail below in such a manner as to enable an ordinary person of ordinary skill in the art to practice the present invention without undue experimentation. However, the present invention is not limited to the embodiments described here, and can be realized as a modification, an alteration, an improvement, and the like. Illustrations of parts that do not relate to descriptions of the embodiments are omitted in the drawings, and like constituent parts are given like reference characters throughout the specification for the purpose of providing a coherent and clear description of the present invention.

Image display devices that will be referred to in the present specification include an apparatus that receives and displays a broadcast signal, an apparatus that records and reproduces a moving image, and an apparatus that records and reproduces an audio signal.

FIG. 1 is a block diagram illustrating an image display device 100 according to the present invention and an external input device 200. The image display device 100 includes a tuner 110, a demodulation unit 120, a signal input and output unit 130, an interface unit 140, a controller 150, a storage unit 160, a display unit 170, and an audio output unit 180. The external input device 200 is a device that is separated from the image display device 100, but may be included as one constituent element of the image display device 100.

Referring to FIG. 1, the tuner 110 selects a radio frequency (RF) broadcast signal corresponding to a channel that is selected by a user, from among RF broadcast signals that are received through an antenna, and converts the selected RF broadcast signal into an intermediate frequency signal or a baseband video and audio signal. For example, if the RF broadcast signal is a digital broadcast signal, the tuner 110 converts the RF broadcast signal into a digital IF (DIF) signal. In contrast, if the RF broadcast signal is an analog broadcast signal, the tuner 110 converts the RF broadcast signal into an analog baseband video/audio signal (CVBS/SIF). In this manner, the tuner 110 is a hybrid tuner that processes the digital broadcast signal and the analog broadcast signal.

The digital IF (DIF) signal that is output from the tuner 110 is input into the demodulation unit 120, the analog baseband video/audio signal (CVBS/SIF) that is output from the tuner 110 is input into the controller 150.

The tuner 120 receives a single carrier RF broadcast signal in compliance with the Advanced Television Systems Committee (ATSC) standards or a multiple-carrier RF broadcast signal in compliance with the Digital Video Broadcasting (DVB) standards.

Although one tuner 110 is illustrated in the drawing, the image display device 100 is not limited to this and may include multiple tuners, for example, first and second tuners. In this case, the first tuner receives a first RF broadcast signal corresponding to a broadcast channel that is selected by the user, and the second tuner receives a second RF broadcast signal corresponding to an already-stored broadcast channel, sequentially or periodically. Like the first tuner, the second tuner converts the RF broadcast signal into the digital IF (DIF) signal, or into the analog baseband video and audio signal (CVBS/SIF).

The demodulation unit 120 receives a digital IF (DIF) signal that results from the conversion by the tuner 110 and performs a demodulation operation on the digital IF (DIF) signal.

If the digital IF (DIF) signal, which is output from the tuner 110, is in the ATSC format, the demodulation unit 120 performs 8-vestigial side band (8-VSB) modulation. The 8-vestigial side band (8-VSB) demodulation is demodulation in compliance with a vestigial sideband modulation scheme for single carrier wave amplitude modulation that uses a National Television System Committee (NTSC) frequency band. At this time, the demodulation unit 120 may perform channel decoding, such as Trellis decoding, de-interleaving, and Reed-Solomon decoding. To do this, the demodulation unit 120 includes a Trellis decoder, a de-interleaver, a Reed-Solomon decoder, and the like.

If the digital IF (DIF) signal, which is output from the tuner 110, is in the DVB format, the demodulation unit 120 performs Coded Orthogonal Frequency Division Modulation (COFDMA) modulation. At this time, the demodulation unit 120 may perform channel decoding, such as convolution decoding, de-interleaving, and Reed-Solomon decoding. To do this, the demodulation unit 120 includes a convolution decoder, a de-interleaver, and a Reed-Solomon decoder.

The demodulation unit 120 performs demodulation and channel decoding in this manner and then outputs a stream signal (TS). At this time, the stream signal results from multiplexing a video signal, an audio signal, and a data signal. For example, the stream signal (TS) is an MPEG-2 Transport Stream (TS) that results from multiplexing an MPEG-2 standard video signal, a Dolby AC-3 standard audio signal, and the like. At this point, the MPEG-2 TS includes a 4-byte header and a 184-bit payload.

A signal that is output in this manner from the demodulation unit 120 is input into the controller 150 and goes through inverse multiplexing and video/audio signal processing.

The signal input and output unit 130 is connected in a wired or wireless manner to an external apparatus, for example, a digital versatile disk (DVD) player, a Blu-ray disk player, a game apparatus, a camera, a videotape recorder, a notebook computer, a set-top box, a portable device, a smart phone, or the like, and performs signal input and output operations. To do this, the signal input and output unit 130 includes an A/V input and output unit for connection to a wired network and a wireless communication unit for connection to a wireless network.

The AN input and output unit includes an Ethernet port, a USB port, a Composite Video Banking Sync (CVBS) port, a composite port, an S-video port (analog), a Digital Visual Interface (DVI) port, a High Definition Multimedia Interface (HDMI) port, a Mobile High-definition Link (MHL) port, a RGB port, a D-SUB port, an IEEE 1394 port, a SPDIF port, a Liquid HD port, and the like. A digital signal that is input through these ports is transferred to the controller 150. At this time, an analog signal that is input through the CVBS port and the S-VIDEO port is by an analog-to-digital converter (not illustrated) converted into a digital signal and the resulting digital signal is transferred to the controller 150.

The wireless communication unit makes a connection to the wireless Internet. The wireless communication unit makes a connection to the wireless Internet by using wireless communication technologies, such as Wireless LAN (WLAN) (Wi-Fi), Wireless Broadband (Wibro), World Interoperability for Microwave Access (Wimax), and High Speed Downlink Packet Access (HSPPA). In addition, the wireless communication unit performs short-range communication with a different electronic apparatus. For example, the wireless communication unit performs short-range communication by using short-range communication technologies, such as Bluetooth, Radio Frequency Identification (RFID), Infrared Data Association (IrDA), Ultra Wideband (UWB), and ZigBee.

The signal input and output unit 130 makes a connection to a predetermined web page through a wired or wireless network, and transmits and receives data to and from a corresponding server. Additionally, the signal input and output unit 130 receives items of content, such as a movie, an advertisement, a game, VOD content, and a broadcast signal, and various pieces of data such as pieces of information relating to the items of content. The items of content and the various pieces of data are provided by a content service provider or a network administer. The signal input and output unit 130 may receive firmware update information and update files that are provided by the network administrator over a wired or wireless network, and may receive an application that are selected by the user from among applications that are placed in the public domain.

The signal input and output unit 130 transfers a video signal, an audio signal, and a data signal that are provided by the external apparatus described above, to the controller 150. In addition, the signal input and output unit 130 transfers a video signal, an audio signal, and a data signal in the form of various media files, which are stored in an external storage device, such as a memory device or a hard disk drive, to the controller 150. In addition, the signal input and output unit 130 transfers a video signal, an audio signal, and a data signal that result from processing by the controller 150, to the external apparatus described above, or a different external apparatus.

More specifically, the signal input and output unit 130 makes a connection to a set-top box, for example, a set-top box for Internet Protocol TV (IPTV), through at least one of the various ports described above, and performs signal input and output operations. In addition, the signal input and output unit 130 may transfer to the controller 150 a video signal, an audio signal, and a data signal that results from processing for bidirectional communication, which is performed by the set-up box for IPTV, and may transfer signals that result from the processing by the controller 150 back to the set-top box for IPTV. The IPTV here includes ADSL-TV, VDSL-TV, and FTTH-TV that are distinguished by a transmission network. The IPTV includes TV over DSL, Video over DSL, TV over an IP (TVIP), Broadband TV (BTV) and the like. Additionally, the IPTV includes Internet TV and full browsing TV in which an Internet connection is possible.

A digital signal that is output from the signal input and output unit 130 also includes a stream signal (TS). As described above, the stream signal (TS) is a signal that results from multiplexing a video signal, an audio signal, and a data signal.

The interface unit 140 transfers to the controller 150 a signal that is input by the user, or transfers to the user a signal that transferred from the controller 150.

The interface unit 140 transfers to the controller 150 a user input signal that is input into a power key, a channel key, a volume key, a setting key and the like. In addition, the interface unit 140 includes a sensing unit (not illustrated) for sensing a user's gesture, a user's location, a touch, and the like. To do this, the sensing unit includes a touch sensor, an audio sensor, a location sensor, a motion sensor, a gyro sensor, and the like. In such a case, the interface unit 140 transfer to the controller 150 an input signal that is input from the sensing unit, or transmits to the sensing unit a signal that comes from the controller 150.

The interface unit 140 receives an input signal that the user inputs using the external input device 200, for example, a spatial remote controller, in order to perform power source control, channel selection, screen setting and the like, or transmits to the external input device 200 a signal that results from processing by the controller 150. At this time, the interface unit 140 and the external input device 200 are connected to each other in a wired or wireless manner.

In addition, the interface unit 140 receives personal information from the external input device 200 and/or receives information of a web server that is being connected using the personal information. For example, in a case where the mobile terminal approaches the external input device 200 to a predetermined distance or below from the external input device 200 and then performs near field communication (NFC), the external input device 200 receives the personal information and the like that are stored in the mobile terminal. The personal information here is information that is necessary to log on with a predetermined account in order to make a connection to an electronic apparatus or use a service.

The controller 150 controls general operation of the image display device 100. Specifically, the controller 150 demultiplexes a stream signal (TS) that is received through the tuner 110, the demodulation unit 120, and/or the signal input and output unit 130, or processes signals that result from the demulitplexing. Thus, the controller 150 generates and outputs a signal for video or audio output. For example, the controller 150 controls the tuner 110 in such a manner that an RF broadcast signal corresponding to a channel that is selected by the user or an already-stored channel is tuned to.

A video signal that results from video processing by the controller 150 is transferred to the display unit 170 and thus a video image corresponding to a resolution video signal is output. An audio signal that results from processing by the controller 150 is transferred to the audio output unit 180 and thus a sound is output. In addition, the video signal and/or the audio signal, which are/is processed by the controller 150, are/is input into an output device of the external apparatus through the signal input and output unit 130.

Although they are not illustrated in the drawings, the controller 150 includes, for example, a demultiplexing unit, an video processing unit, an On-Screen Display (OSD) generation unit and an audio processing unit, a data processing unit, a channel browsing processing unit and the like in order to demultiplex a stream signal (TS) or process signals that result from the demultiplexing and thus to generate or output a signal for video output or audio output.

The demultiplexing unit (not illustrated) demultiplexes the stream signal (TS) that is input. For example, in a case where an MPEG-2 stream signal (TS) is input, the demultiplexing unit demultiplexes the MPEG-2 stream signal (TS) into a video signal, an audio signal, and a data signal. The stream signal (TS) here, as described above, is a signal that is output from the tuner 110, the demodulation unit 120, and/or the signal input and output unit 130.

The video processing unit (not illustrated) performs video processing, for example, decoding, on a video signal that results from the demultiplexing. More specifically, the video processing unit decodes a video signal that is coded in compliance with MPEG-2 standards, using an MPEG-2 decoder, and decodes a video signal that is coded in compliance with H.264 standards according to a Digital Multimedia Broadcasting (DMB) scheme or according to a Digital Video Broadcast-Handheld (DVB-H) scheme, using a H.264 decoder. In addition, the video processing unit performs video processing in such a manner that brightness, tint, color, and the like of the video signal are adjusted. In addition, the video processing unit performs scaling in such a manner that the video signal that results from the demultiplexing can be output on the display unit 170. A video signal that results from the video processing by video processing unit is transferred to the display unit 170, or is transferred to an external output device (not illustrated) through an external output port.

The OSD generation unit (not illustrated) generates an OSD signal according to a user input or by itself. More specifically, for example, based on at least one of the video signal and the data signal or on an input signal that is received from the external input device 200, the OSD generation unit generates a signal for displaying various pieces of information in the graphic or text form on a screen of the display unit 170. The generated OSD signal includes various pieces of data, such as a user interface, various menu screens, a widget, and an icon that are provided on the image display device 100, and a pointer corresponding to a pointing signal that is transmitted from the external input device 200. In addition, the generated OSD signal includes a 2-D object or a 3-D object.

The controller 150 mixes the OSD signal that is generated by the OSD generation unit described above and the video signal that is decoded and that results from the video processing by the video processing unit. A video frame rate of a video signal that results from the mixing is changed by a frame rate converter (FRC). In addition, the video signal that results from the mixing is output with its video signal format being changed by a formatter, is separated into a 2-D video signal and a 3-D video signal for 3-D video display, or is converted from a 2-D video signal to a 3-D video signal.

The audio processing unit (not illustrated) performs, audio processing, for example, decoding, on an audio signal that results from the demultiplexing. More specifically, the audio processing unit decodes the audio signal that is coded in compliance with MPEG-2 standards, using the MPEG-2 decoder. Furthermore, the audio processing unit decodes the audio signal that is coded in compliance with MPEG-4 Bit Sliced Arithmetic Coding (BSAC) according to a DMB scheme, using an MPEG-4 decoder. Furthermore, the audio processing unit decodes the audio signal that is coded in compliance with MPEG-2 Advanced Audio Codec (AAC) according to a satellite DMB scheme or a Digital Video Broadcast-Handheld (DVB-H) scheme, using an AAC decoder. In addition, the audio processing unit performs base processing, treble processing, sound volume processing, and the like. An audio signal that results from the audio processing unit performing processing in this manner is transferred to the audio output unit 180, for example, to a speaker, or is transferred to an external output device.

The data processing unit (not illustrated) performs data processing, for example, decoding, on a data signal that results from the demultiplexing. The data signal here includes electronic program guide (EPG) information including broadcast information, such as a broadcasting-starting time of and a broadcasting-ending time of a broadcast program that is broadcast over each channel. The EPG information includes, for example, ATSC-program and System Information Protocol (ATSC-PSIP) in the case of an ATSC scheme, and includes DVB-Service Information (DVB-SI) in the case of a DVB scheme. The ATSC-PSIP information or the DVB-SI information here is included in a header (4 bytes) of an MPEG-2 stream signal (TS).

The channel browsing processing unit (not illustrated) receives a stream signal (TS) that is output from the demodulation unit 120, or a stream signal (TS) that is output from the signal input and output unit 130, as an input, and extracts a video image from each stream signal (TS), thereby generating a thumbnail image. The generated thumbnail image is input into the controller 150 without any change or in a coded state. In such a case, the controller 150 displays a thumbnail list including multiple thumbnail images on the display unit 170, using the thumbnail image that is input. At this time, thumbnail images on the thumbnail list may be displayed on all regions of the display unit 170, or may be displayed on one region of the display unit 170 in a manner that provides convenient viewing. In addition, the thumbnail images on the thumbnail list are sequentially updated.

On the other hand, the controller 150 performs signal processing on an analog baseband video/audio signal (CVBS/SIF) as well. For example, the analog baseband video and audio signal (CVBS/SIF) that is input into the controller 150 is an analog baseband video/audio signal that is output from the tuner 110 or the signal input and output unit 130. The controller 150 performs control, in such a manner that the analog baseband video/audio signal (CVBS/SIF) that is input is processed, a video signal that results from signal processing is displayed on the display unit 170, and an audio signal that results from signal processing is output to the audio output unit 180.

In addition, the controller 150 controls operation of the image display device 100 using a user command that is input through the signal input and output unit 130 or through the interface unit 140, or using an internal program. More specifically, the controller 150 determines whether or not each external apparatus and the like are connected, according to personal information from the external input device 200, based on apparatus information on an adjacent external apparatus in the vicinity of the image display device 100, which is received from the signal input and an output unit 130 or from the interface unit 140, and based on information on a channel, a frequency, or a code, through which a different external apparatus can be remotely controlled. Then, the controller 250 performs control in such a manner that an object indicating that the external apparatus is connected is displayed on the display unit 270.

In addition, the controller 150 displays at least one object that is to be displayed on the display unit 170, as a 3-D object. For example, in addition to a Web screen (a newspaper, a magazine, and the like) that is in a connected state and an electronic program guide (EPG), the object here is at least one among a menu, a widget, an icon, a still image, a moving image, and a text image.

In addition, the controller 150 detects a user's gesture by analyzing individually or combinedly a video image that is captured by a photographing device (not illustrated), a signal that is detected by a sensing unit (not illustrated), and an input signal that is transmitted by the external input device 200.

In addition, the controller 150 recognizes a location of the user, based on images that are captured by the photographing unit (not illustrated). For example, the controller 250 knows a distance (an X-axis coordinate) between the user and the image display device 100, and additionally knows X-axis and Y-axis coordinates of the location of the user on the display unit 170.

A program for signal processing and control by the controller 150 may be stored in the storage unit 160. Furthermore, the video signal, the audio signal, and the data signal that result from the signal processing may be stored in the storage unit 160. Furthermore, information relating to a predetermined broadcast channel, and the like may be stored in the storage unit 160, through a channel memory function such as channel mapping. The storage unit 160 includes at least one storage medium among a flash memory, a hard disk, a multimedia card micro type, a card type memory (for example, a SD or XD memory or the like), a random access memory (RAM), a static random access memory (SRAM), a read-only memory (ROM), an electrically erasable programmable read-only memory (EEPROM), a programmable read-only memory (PROM), a magnetic memory, a magnetic disc, and an optical disc.

In addition, IR format key codes for controlling different external apparatuses may be stored in the storage unit 160, and IR format key database for multiple external apparatuses may be stored in the storage 160.

The video signal, the data signal, and the OSD signal that result from the processing by the controller 150, and a video signal, a data signal, a control signal, and the like that are received from the signal input and output unit 130 or from the interface unit 140 are converted into a RGB signal, and thus a drive signal is generated. Through this process, the resulting image is output to the display unit 170. The display unit 170 is realized in various forms such as a plasma display panel (PDP), a liquid crystal display (LCD), a thin film transistor-liquid crystal display (TFT-LCD), an organic light emitting diode (OLED), a flexible display, a 3-D display, and an e-ink display.

For example, in a case where the display unit 170 is for 3-D display, this is realized as an additional display type or as a single display type for 3-D video viewing. The display unit 170 as the single display type realizes a 3-D image by itself, without a separate display, for example, without glasses. Application examples of this, there are a lenticular type and a parallax barrier type. In addition, the display unit 170 as the additional display type realizes a 3-D image using a 3-D viewing device. Application examples of this, there are a head-mounted display (HMD) type and a glasses type.

In addition, in a case where the display unit 170 is realized as a touch screen that is equipped with a touch sensor, the display unit 170 functions as an input device as well as an output device.

The touch sensor is configured in such a manner that a pressure which is applied to a specific portion of the display unit 170, or a change in electrostatic capacitance, and the like which occur in a specific portion of the display unit 170 is converted into an electrical input signal. The touch sensor is configured in such a manner that a position on the touch sensor, which a touch tool touches on, and an area of a place on the touch sensor, which the touch tool touches on, are detected. Additionally, the touch sensor is configured in such a manner that a pressure which is applied to the touch sensor when the touch tool touches on the touch sensor is detected. The touch tool here is an object that comes into contact with the touch sensor for touch application. The touch tools include, for example, a finger, a touch pen or a stylus, a pointer and the like. In a case where a touch input is applied to the touch sensor, a signal (signals) corresponding to the touch input is (are) sent to a touch controller. After processing the signal(s), the touch controller transfers the corresponding data to the controller 150. Accordingly, the controller 150 knows which region of the display unit 170 is touched on.

The audio output unit 180 receives an audio signal that results from processing by the controller 150, for example, a stereo signal or a 5.1 channel signal, as an input, and outputs a sound corresponding to the audio signal. To do this, the audio output unit 180 is realized as various types of speakers.

The image display device 100 includes the photographing unit (not illustrated) for photographing the user. The photographing unit is realized as one camera, but is not limited to this. The photographing unit can be realized to include the multiple cameras. Video Information on a video image that is captured by the photographing unit is input into the controller 150, and the controller 150 accordingly detects the user's gesture, based on the captured image.

In addition, the image display device 100 includes a video communication unit (not illustrated) that is configured to include a microphone (not illustrated) as well as a photographing unit (not illustrated). The controller 150 performs the signal processing on the video information on the image that is captured by the photographing unit and audio information that is collected by the microphone and transmits a result of the signal processing to a video communication apparatus of the other party through the signal input and output unit 130 or through the interface unit 140. A power supply unit 190 supplies electric power to all constituent elements of the image display device 100. Specifically, the power supply unit supplies electric power to the controller 150 that is realized in a type of System-On-Chip (SOC), the display unit 170 for video display, and the audio output unit 180 for audio output.

To do this, the power supply unit 190 (not illustrated) includes a converter (not illustrated) that converts DC power into AC power. On the other hand, for example, in a case where the display unit 170 is realized as a liquid crystal panel including multiple backlight lamps, the power supply unit 190 may further include an inverter (not illustrated) in which a PWM operation is possible for brightness variableness or dimming drive.

The external input device 200 is connected to the interface unit 140 in a wired or wireless manner and transfers an input signal that is generated according to the user input, to the interface unit 140. The external input devices 200 include a remote controller (for example, a spatial remote controller), a mouse, a keyboard, a wheel, and the like. The remote controller transmits an input signal to the interface unit 140 by using communication technologies such as Bluetooth, RF, Infrared Data Association (IrDA), Ultra Wideband (UWB), and ZigBee. In a case where the external input device 200 is realized, specifically, as a spatial remote controller, the external input device 200 generates an input signal by detecting a movement of a main body.

On the other hand, the image display device 100 is realized as a fixed-type digital broadcast receiver or a mobile-type digital broadcast receiver.

In a case where the image display device 100 is realized as the fixed-type digital broadcast receiver, the image display device 100 can be realized in such a manner as to receive at least one broadcast scheme, among digital broadcast in compliance with an ATSC scheme (8-VSB scheme) that uses a single carrier, digital broadcast in compliance with a ground wave DVB-T scheme (COFDM scheme) that uses multiple carriers, and digital broadcast in compliance with an ISDB-T scheme (BST-OFDM type) digital broadcast that allows a different broadcast channel to be used according to a user authority.

In a case where the image display device 100 is realized as the mobile-type digital broadcast receiver, the image display device 100 is realized in such a manner as to receive at least one broadcast scheme, among digital broadcast in compliance with a ground wave DMB scheme, digital broadcast in compliance with a satellite DMB scheme, digital broadcast in compliance with an ATSC-M/H scheme, digital broadcast in compliance with a Digital Video Broadcast-Handheld (DVB-H) scheme, and digital broadcast in compliance with a Media Forward Link-Only scheme.

On the other hand, the image display device 100 is realized as a digital broadcast receiver for cable communication, satellite communication or IPTV.

In addition, the image display device 100 described above is applied to the mobile terminal as well. The mobile terminals include a mobile phone, a smart phone, a laptop computer, a terminal for digital broadcast, a personal digital assistant (PDA), a portable multimedia player (PMP), a navigation system, a slate PC, a tablet PC, a high-end subnotebook computer and the like.

In a case where the image display device is used as the mobile terminal, the image display device may further include a wireless communication unit, instead of using the configuration described above. The wireless communication unit enables wireless communication between the mobile terminal and a wireless communication system or between the mobile terminal and a network, within whose coverage the mobile terminal is present.

To this end, the wireless communication unit includes at least one among a broadcast receiving module, a mobile communication module, a wireless Internet module, a short-range communication module and a positional information module.

The broadcast receiving module receives a broadcast signal and/or broadcast-related information from a broadcast administration server over a broadcast channel.

The broadcast channels here include a satellite channel, a ground wave channel and the like. In addition, the broadcast administration server means a server that generates and transmits a broadcast signal and/or a broadcast-related information, or means a server that is provided with a broadcast signal that is already generated and/or broadcast-related information that is already generated and transmits them to the mobile terminal. The broadcast signals here include not only a TV broadcast signal, a radio broadcast signal, and a data broadcast signal, but also a broadcast signal that results from combining the TV broadcast signal or the radio broadcast signal and a data signal.

The broadcast-related information means information relating to a broadcast channel, a broadcast program, or a broadcast service provider. The broadcast-related information is provided over a mobile communication network. In addition, the broadcast-related information comes in various forms. For example, the broadcast-related information comes in the form of an electronic program guide (EPG) in Digital Multimedia Broadcasting (DMB), or an electronic service guide (ESG) in Digital Video Broadcast-Handheld (DVB-H).

The broadcast receiving module receives a digital broadcast signal, using broadcast schemes such as a Digital Multimedia Broadcasting-Terrestrial (DMB-T) scheme, a Digital Multimedia Broadcasting-Satellite (DMB-S) scheme, a Media Forward Link Only (MediaFLO) scheme, a Digital Video Broadcast-Handheld (DVB-H) scheme, a Convergence of Broadcasting and Mobile Service (DVB-CBMS) scheme, an Open Mobile Alliance-BroadCAST (OMA-BCAST) scheme, a China Multimedia Mobile Broadcasting (CMMB) scheme, a Mobile Broadcasting Business Management system (MBBMS) scheme, and an Integrated Services Digital Broadcast-Terrestrial (ISDB-T) scheme. Of course, the broadcast receiving module may be configured in such a manner that it is suitable not only for the digital broadcasting system described above, but also for a different broadcasting system.

The broadcast signal and/or the broadcast-related information that are received through the broadcast receiving module are stored in a memory.

The mobile communication module transmits and receives a wireless signal to and from at least one among a base station, an external terminal, and a server, over a mobile communication network. The wireless signal includes a voice call signal, a video telephone call signal, or various forms of pieces of data that are involved in transmitting and receiving of a text/multimedia message.

The mobile communication module is configured in such a manner as to realize a video communication mode and a voice communication mode. The video communication mode refers to a mode in which the user has a telephone conversation with the other party while viewing a moving image of the other party at the same time. The voice communication mode refers to a mode in which the user has a telephone conversation with the other party without viewing the moving image of the other party.

The mobile communication module is configured in such a manner as to transmit and receive at least one among a voice call and a video image to realize the video communication mode and the voice communication mode.

The wireless Internet module is a module for connection to the wireless Internet and is built into the mobile terminal, or is provided independently of the mobile terminal. Wireless Internet technologies are used such as Wireless LAN (WLAN), Wireless Fidelity (WiFi) Direct, Digital Living Network Alliance (DLNA), Wireless broadband (Wibro), World Interoperability for Microwave Access (Wimax), High Speed Downlink Packet Access (HSDPA), GSM, CDMA, WCDMA, and Long Term Evolution (LTE).

The short-range communication module refers to a module for short-range communication. Short-range communication network technologies are used such as Bluetooth, Radio Frequency Identification (REID), Infrared Data Association (IrDA), Ultra Wideband (UWB), ZigBee, Near Field Communication (NFC), and WiFi Direct.

The positional information module is a module for acquiring a location of the mobile terminal and its typical example is a Global Position System (GPS) module or a WiFi (Wireless Fidelity (WiFi) module.

Figure 2:
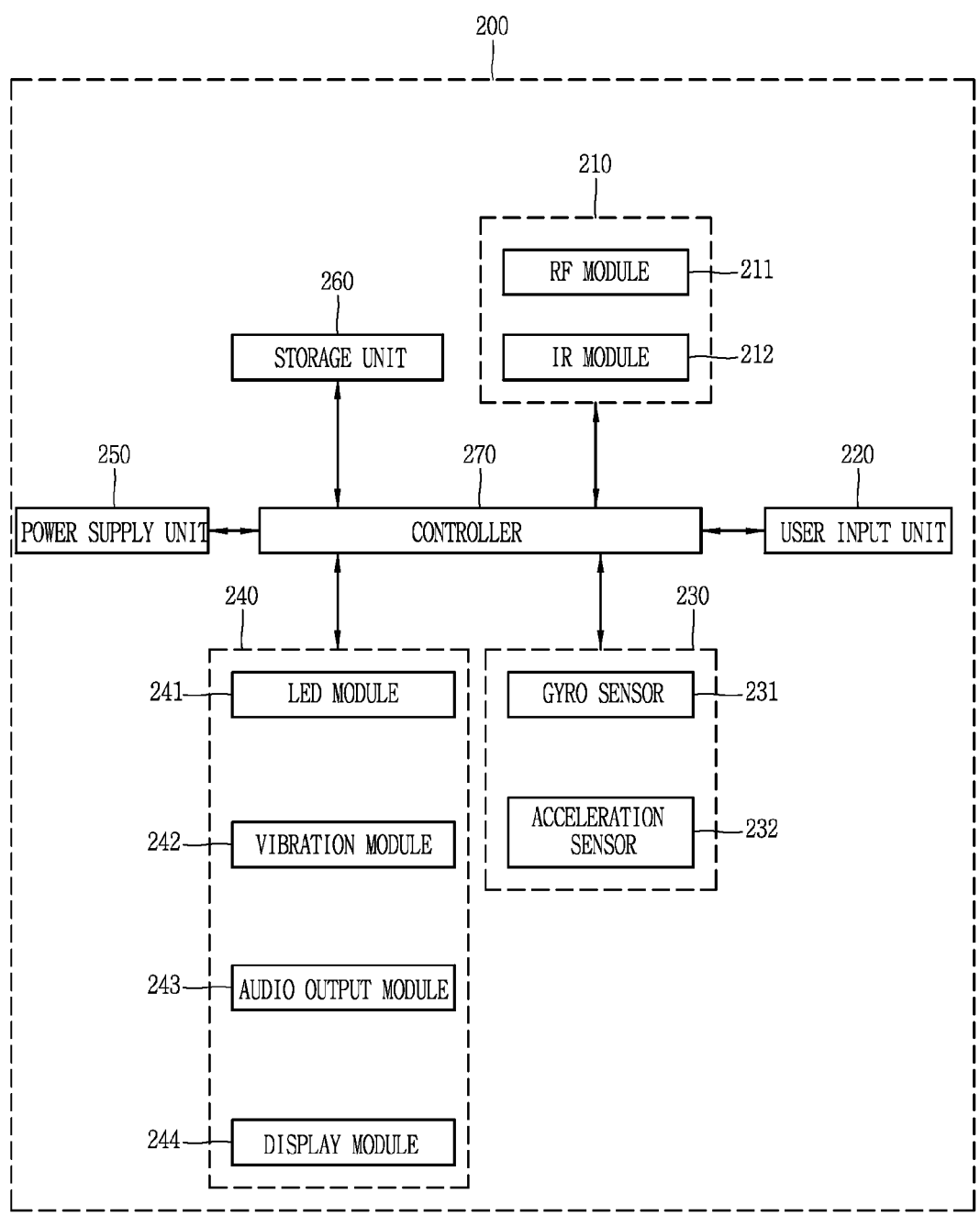
FIG. 2 is a block diagram illustrating the external input device in FIG. 1 in detail.

FIG. 2 is a block diagram illustrating in detail the external input device 200 in FIG. 1. The external input device 200 is configured to include a wireless communication unit 210, a user input unit 220, a detection unit 230, an output unit 240, a power supply unit 250, a storage unit 260 and a controller 270.

Referring to FIG. 2, the wireless communication unit 210 transmits a signal to the image display device 100 or receives a signal from the image display device 100. To do this, the wireless communication unit 210 includes an RF module 211 and an IR module 212. The RF module 211 is connected to the interface unit 140 of the image display device 100 and transmits and receives a signal to and from the interface unit 140 according to RF communication standards. The IR module 212 transmits and receives a signal to and from the interface unit 140 of the image display device 100 according to IR communication standards. For example, the wireless communication unit 210 transmits a signal that includes pieces of information on a movement of the external input device 200 and the like, to the image display device 100 through the RF module 211.

On the other hand, the external input device 200 further includes an NFC module (not illustrated) for a short-range magnetic field communication with a predetermined external apparatus. Through the short-range magnetic field communication with the external apparatus, the external input device 200 receives personal information, information of a Web server that is connected using the personal information, and the like, and transfers the pieces of information that are received, to the image display device 100 through the RD module 211 or the IR module 212.

In addition, the external input device 200 transmits a signal to the interface unit 140 of the image display device 100, using communication technologies such as Bluetooth, Infrared Data Association (IrDA), Ultra Wideband (UWB), ZigBee, and short-range magnetic field communication (NFC).

The external input device 200 receives a video signal, an audio signal, a data signal, or the like that is output from the interface unit 140 of the image display device 100. Then, the external input device 200 displays the video signal or the data signal that is received, on the output unit 240, or outputs the audio signal that is received, as audio.

In addition, the external input device 200 may receive apparatus information for performing remote control of a different external apparatus, such as channel information, frequency information, code information, or the like, from an adjacent external apparatus in the vicinity of the external input device 200. Furthermore, based on the apparatus information, the external input device 200 may assign a channel, a frequency, or a code to the different external apparatus, and may perform the remote control.

The user input unit 220 is an input unit, for example, such as a keypad, a key button, a touch screen, a scroll key, or a jog key. The user operates the user input unit 220 to input a control command associated with the image display device 100. The user can input such a control command, for example, by pushing down a hardware key button of the user input unit 220. In addition, for example, in a case where the user input unit 220 includes a touch screen, the user inputs the control command by touching on a software key of the touch screen.

The user input unit 220 includes, for example, an OKAY key, a menu key, a four-direction control key, a channel tuning key, a volume adjustment key, a BACK key, a HOME key, and the like. The OKAY key (not illustrated) is used to select a menu or an item. The menu key (not illustrated) is used to display a predetermined menu. The four-direction control key is used to move a pointer or an indicator that is displayed on the display unit 170 of the image display device 100, upward, downward, leftward, and rightward. In addition, the channel tuning key (not illustrated) is used to tuning in on a specific channel. The volume adjustment key (not illustrated) is used to adjust a volume in such a manner as to make it be down low or up high. In addition, the BACK key (not illustrated) is used to move back to a previous screen. The HOME key (not illustrated) is used to move to a home screen.

The OKAY key is realized as a key that is configured to additionally have a rotation function. To do this, the OKAY key is realized as a key that is configured to take the form of a wheel key. That is, in a case where the user pushes on the OKAY key upward, downward, leftward, or rightward, the OKAY key is used to select a corresponding menu or item. Furthermore, in a case where a wheel that is mounted is rotated forward or backward, a screen that is output to the display unit 170 of the image display device 100 is scrolled in a direction corresponding to a direction of the wheel rotation, or is switched to a next list page or a previous list page. For example, in a case where only one portion of a screen that is to be displayed is displayed on the display unit 170, when a wheel of the OKAY key is rotated to search for a desired portion of the screen, other portions of the screen that were not previously output to the display unit 170 are currently output to the display unit 170. As another example, in a case where a list page is displayed on the display unit 170, when the wheel of the OKAY key is rotated, a page that precedes or follows a current page that is displayed on the display unit 170 is displayed.

In addition, the rotation function of the OKAY key may be realized as a function that is performed by a separate key.

The detection unit 230 includes a gyro sensor 231 and an acceleration sensor 232. The gyro sensor 231 detects a spatial movement of the external input device 200 based on an X-axis, a Y-axis, and a Z-axis. The acceleration sensor 232 detects a speed at which the external input device 200 moves.

In addition, the detection unit 230 further includes a distance measurement sensor to detect a distance to the display unit 170.

The output unit 240 outputs information corresponding to operation of the user input unit 220 and information corresponding to a signal that is transferred by the image display device 100. The user can recognize an operated state of the user input unit 220 or a controlled state of the image display device 100 through the output unit 240. The output unit 240 includes an LED module 241, a vibration module 242, an audio output module 243, and a display module 244. The LED module 241 emits light, the vibration module 242 generates vibration, an audio output module 243 outputs a sound, and a display module 244 displays a video image, in response to the operation of the user input unit 220 or in response to a signal transmitted and received that is through the wireless communication unit 210.

The power supply unit 250 supplies electric power to various electronic elements of the external input device 200. In a case where the external input device 200 is not moved for a predetermined time, the power supply unit 250 stops supplying electric power to reduce power consumption. In a case where a predetermined key of the external input device 200 is operated, the power supply unit 250 resumes the supplying of electric power.

Various programs, applications, frequency bandwidth information, and the like that are associated with control and operation of the external input device 200 are stored in the storage unit 260. In addition, IR format key codes for controlling different external apparatuses with an IR signal are stored in the storage unit 260. Furthermore, IR format key database of multiple external apparatuses are stored in the storage unit 260.

The controller 270 generally controls all matters that are associated with the control of the external input device 200. The controller 270 transfers a signal corresponding to operation of a predetermined key of the user input unit 220 to the image display device 100 through the wireless communication unit 210. In addition, the controller 270 transfers a signal corresponding to a movement of the external input device 200 that is detected by the detection unit 230 to the image display device 100 through the wireless communication unit 210. The image display device 100 calculates coordinates of a pointer corresponding to the movement of the external input device 200.

Figure 3:
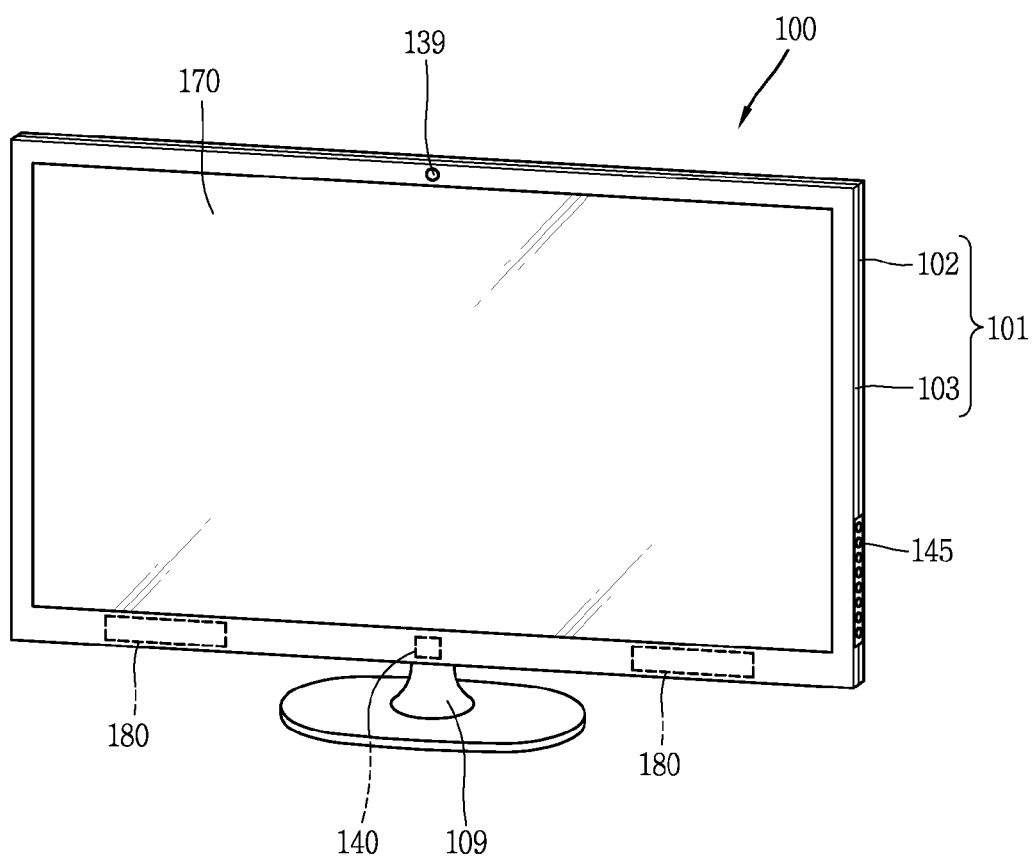
FIG. 3 is a perspective diagram of an image display device according to one embodiment of the present invention, when viewed from the front.

FIG. 3 is a perspective diagram of an image display device 100 according to one embodiment of the present invention, when viewed from the front.

The image display device 100 according to the present invention includes a main body 101 that constitutes an external appearance thereof. A case (a casing, a housing, a cover or the like) that constitutes the external appearance of the main body 101 are configured from a front case 102 and a rear case 103. Various electronic components are built into a space that is formed between the front case 102 and the rear case 103.

The main body 104 is held in place by a support 109 resting on a flat surface.

The cases may be formed as a result of injecting synthetic resin into a mold. Alternatively, a metal material, such as stainless steel (STS) or titanium (Ti) may be formed into the cases.

The display unit 170 is arranged in the front case 102. The display unit 170 is formed in such a manner as to occupy most portions of a main surface (a front surface) of the image display device 100.

The front case 102 is configured to have the shape of a tetragonal band with a predetermined width or is configured to have the shape of a tetragonal plate that covers all portions of the front surface of the display unit 170. In the former case, not only an edge of the front surface of the display unit 151, to which a video image is not output, is shielded, but an edge portion of the display unit 170 is also prevented from being damaged by an external force. In the latter case, the front case 102 is plate-shaped and is made of a transparent material that allows light to pass through. Thus, the front case 102 is a plastic panel that is formed as a result of injecting resin using an injection compression molding technique, or is made of glass that is reinforced through compression. Then, an edge of the front case 102 covers an edge portion of the display unit 170, which is surrounded by an opaque film layer or a coating layer and thus does not allow light to pass through.

The signal input and output unit 130, the audio output unit 180, or the interface unit 140 is formed on the front case 102 or on the rear case 103. Then, the multiple signal input and output units 130, the multiple audio output units 180, or the multiple interface units 140 are formed. At this point, one of multiple signal input and output units 130, multiple audio output units 180 and multiple interface units 140 is formed on the front case 102, and another one is formed on the rear case 103.

Then, a photographing unit 139 is formed on the main body 101. The photographing unit 139 is formed on the main body 101 in such a manner that the photographing unit 139 can rotate or pop up. The photographing unit 139 processes a video frame, such as a still image or a moving image, which is obtained by an image sensor in the video communication mode or in a photographing mode. The processed video frame is displayed on the display unit 170. Then, the processed video frame is stored in the storage unit 160 or is transferred through the signal input and output unit 130 to the outside. Two or more of the photographing units 139 may be provided depending on an environment in which the photographing unit 139 is used.

Video information on the user is acquired through the photographing unit 139. The photographing unit 139 and a microphone together constitute the video communication unit.

A user input unit 145 is formed on one flank side of the main body 101. The user input unit 145 is operated to input a command for controlling the operation of the image display device 100. The user input unit 145 includes multiple operation units. The operation portion units are also collectively referred to as a manipulating portion. Any manner that performs an operation while giving the user a feeling of tactile contact can be employed. For example, the operation portions include a power on/off key, a channel key, a volume key, a setting key, and the like.

Figure 4:
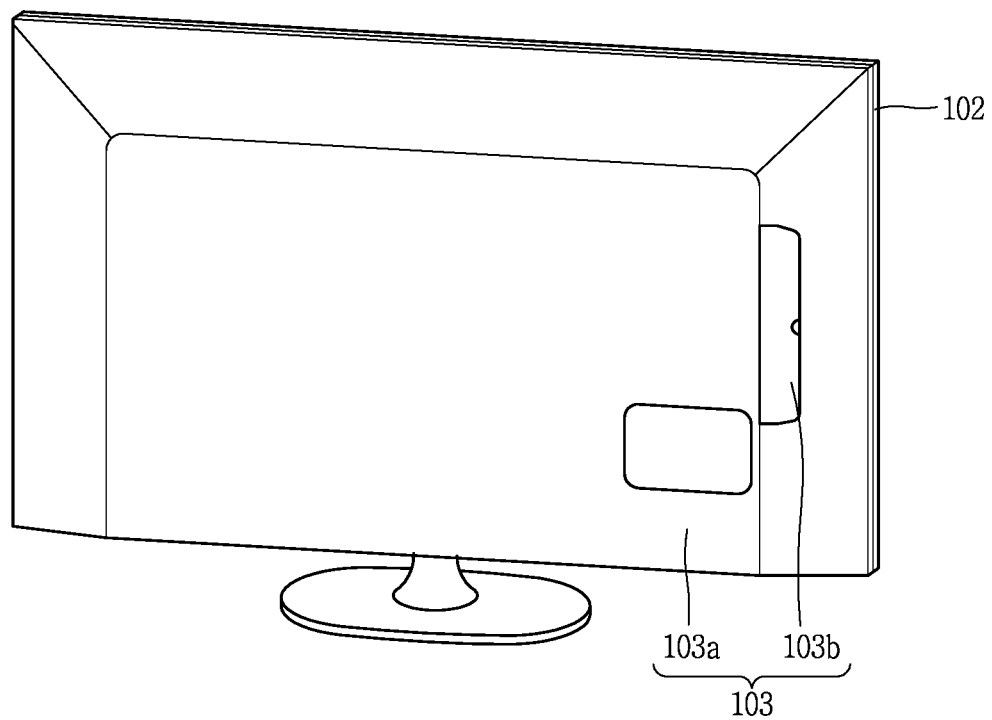
FIG. 4 is a perspective diagram of the image display device according to one embodiment of the present invention, when viewed from the rear.

FIG. 4 is a perspective diagram of an image display device 100 according to one embodiment of the present invention, when viewed from the rear.

The rear case 103 is formed in such a manner as to constitute an external appearance of a rear surface of the image display device 100. The rear case 103 is formed in such a manner as to cover all portions of the rear surface of the image display device 100 or to cover most portions of the rear surface with one portion thereof being excluded.

The rear case 103 includes one or more opening portions. The signal input and output unit 130 of the image display device 100 is exposed through an opening portion 103c. The signal input and output unit 130 includes an Ethernet port, a USB port, a Composite Video Banking Sync (CVBS) port, a composite port, a S-video port (analog), a Digital Visual Interface (DVI) port, a High Definition Multimedia Interface (HDMI) port, a Mobile High-definition Link (MHL) port, a RGB port, a D-SUB port, an IEEE 1394 port, a SPDIF port, a Liquid HD port, other video or audio ports, sockets for accommodating a removable card, wired or wireless communication ports, and the like.

In addition, a power supply port is exposed through a different opening portion. Electric power is supplied from an external power source through the power supply port to devices within the image display device 100.

The rear case 103 includes a first member 103a that corresponds to the main surface thereof and a second member 103b that is coupled to the first member 103a in such a manner as to rotate with respect to the first member 103a. At this point, the first member 103a includes the opening portion 103c, and the second member 103b is coupled to the first member 103a in such a manner as to open and close the opening portion 103c.

The middle portion of the first member 103a is formed in such a manner as to have a flat surface whose curvature is close to zero, and border portions other than the middle portion are formed in such a manner as to have a curved surface whose curvature is uniform.

The opening portion 103c may be formed in the middle portion and may be formed in the border portion. When the opening portion 103c is formed in the border portion, the second member 103b may be coupled to the first member 103a in such a manner as to open and close the opening portion 103c.

Figure 5:
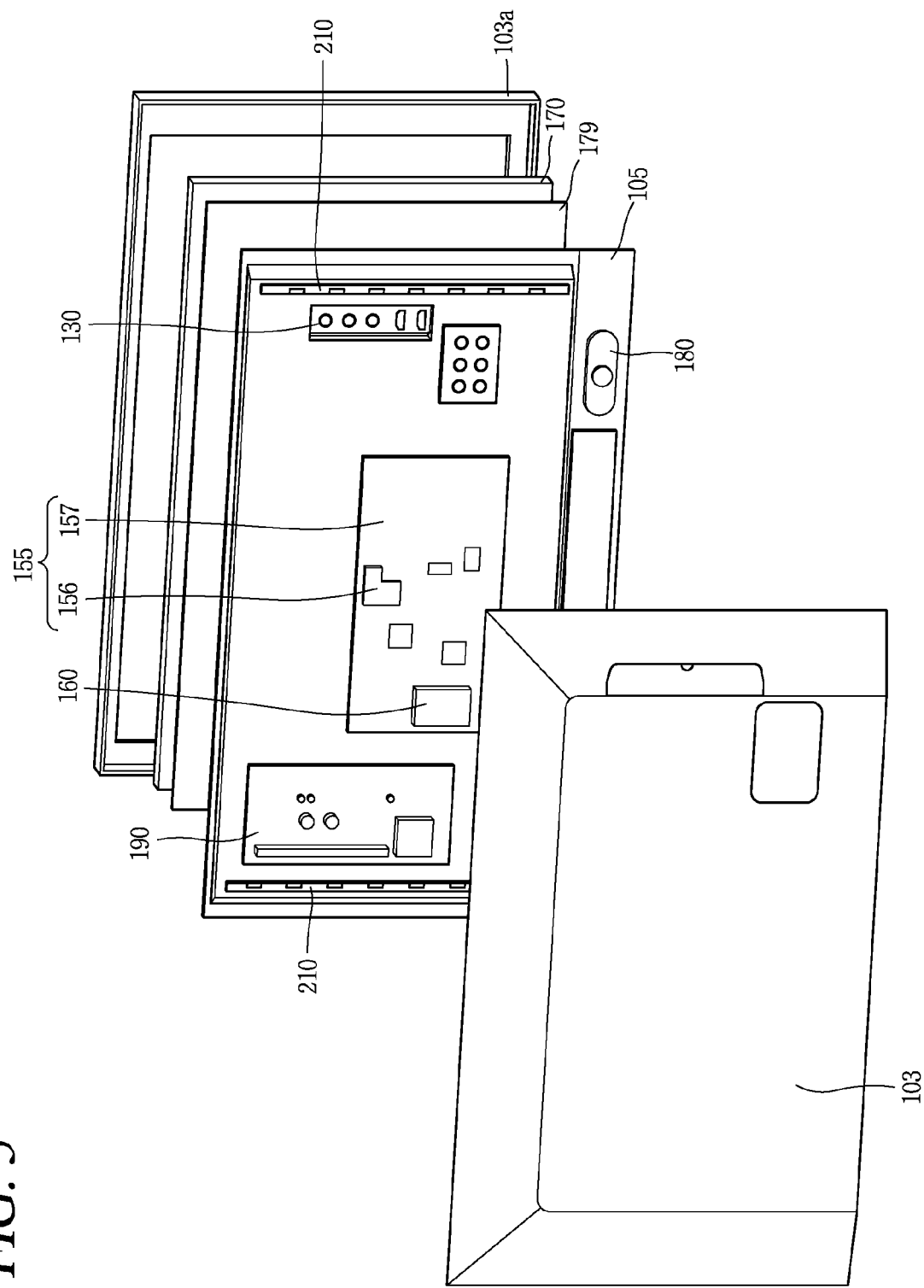
FIG. 5 is a perspective exploded diagram of the image display device that is illustrated in FIG. 4.

FIG. 5 is a perspective exploded diagram of the image display device 100 that is illustrated in FIG. 4.

Referring to FIG. 5, the image display device 100 includes the front case 102, the display unit 170, a heat dissipation member 179, a middle case 105 (or a frame 105), and the rear case 103.

The display unit 170 is realized, in hardware, as a display module. The display module may further include a backlight unit in addition to a display panel, according to a type thereof.

As one example, the display module includes the display panel and the backlight unit. In this case, the display panel is a portion on which a video image is realized. Polarizing plates are placed in front of and in back of the rear surface, respectively. Multiple substrates are interposed between the polarizing plates. One of the multiple substrates is also referred to as a TFT array substrate. Multiple scan lines and multiple data lines intersect in a matrix shape and this defines multiple pixels. Then, a thin film transistor (TFT) that can turn on and off a signal is provided in each of the multiple pixels. A pixel electrode that is connected to each of the thin film transistors is positioned in each of the multiple pixels. Then, another one of the multiple substrates is also referred to as a color filter substrate. Provided on the color filter substrate are Red (R), green (G), and blue (B) color filters that correspond to multiple pixels, respectively, and a black matrix that surrounds the color filters and thus distinguishes between scan and data lines and non-display elements such as thin film transistors. Then, a gate drive unit and a data drive unit that generate a drive signal for driving the display panel are provided at the edge of the display panel.

In addition, the backlight unit includes a circuit board layer that includes a PCB, multiple light sources that are mounted on the circuit board layer, a reflection layer that is formed on the upper surface of the circuit board layer, a patterned metal reflection (PMR) layer that is a distance away from the reflection layer and is placed on the upper surfaces of the light sources, and a diffusion layer that is placed on the PMR layer, in this order when viewed from below. The light source here is among a light emitting diode (LED) chip and a light emitting diode package including at least one light emitting diode chip.

The heat dissipation member 179 is formed in such a manner that heat that is generated in the display module is dissipated to the outside. The heat dissipation member 179 is arranged in such a manner as to come into contact with a rear surface of the display module. The heat dissipation member 179 is formed in such a manner as to include at least one among a heat dissipation plate, a heat dissipation sheet, a heat dissipation lubricant, a thermally conductive bonding agent, a heat dissipation gel, a heat dissipation paint, and a phase change material (PCM). A silicone-based or a carbon-based composite material is used for the heat dissipation plate and the heat dissipation sheet. Furthermore, a metal material with high thermal conductivity, such as copper, is used for the heat dissipation plate and the heat dissipation sheet. The middle case 105 that is formed in such a manner as to support the inside of the image display device 100 is formed on a rear surface of the heat dissipation member 179. In addition, the middle case 105 is formed as a result of injecting synthetic resin into a mold. Alternatively, for example, the middle case 105 may be in the form of a frame that is made of a metal material, such as stainless steel (STS) or titanium (Ti).

A drive unit 155 is formed on a rear surface of the middle case 105. The drive unit 155 is coupled to the middle case 105, or is coupled to the middle case 105 in such a manner that a cover for the drive unit 155 covers the drive unit 155. The drive unit 155 includes a circuit board 157 and a drive controller 156.

At this point, the drive controller 156 includes a timing controller. The timing controller is formed in such a manner as to adjust an operation timing for each drive circuit of the display panel. The circuit board 157 is formed in such a manner that one or more microcomputer-type chips are mounted on the circuit board 157. Each of the microcomputer-type chips constitutes a portion of a controller. As one example, any one of the microcomputer-type chips is a portion that transfers a V sync signal, an H sync signal, and an RGB resolution signal to the timing controller.

Then, the storage unit 160 is mounted, in the form of a hard disk, on the circuit board 157.

In addition, electric power is supplied from an external power source to the power supply unit 190, and the power supply unit 190 applies electric power to each of the devices (for example, the display panel or the backlight unit) within the image display device 100.

Various ports that constitute the signal input and output unit 130 are formed in such a manner that they are electrically connected to the circuit board 157. To do this, various ports are formed on a separate circuit board, and are electrically connected to the circuit board 157 that constitutes the controller 156.

The rear case 103 is formed in such a manner as to cover a rear surface of the main body 101. The rear case 103 is coupled to the front case 102 or is coupled to the middle case 105.

Figure 6:
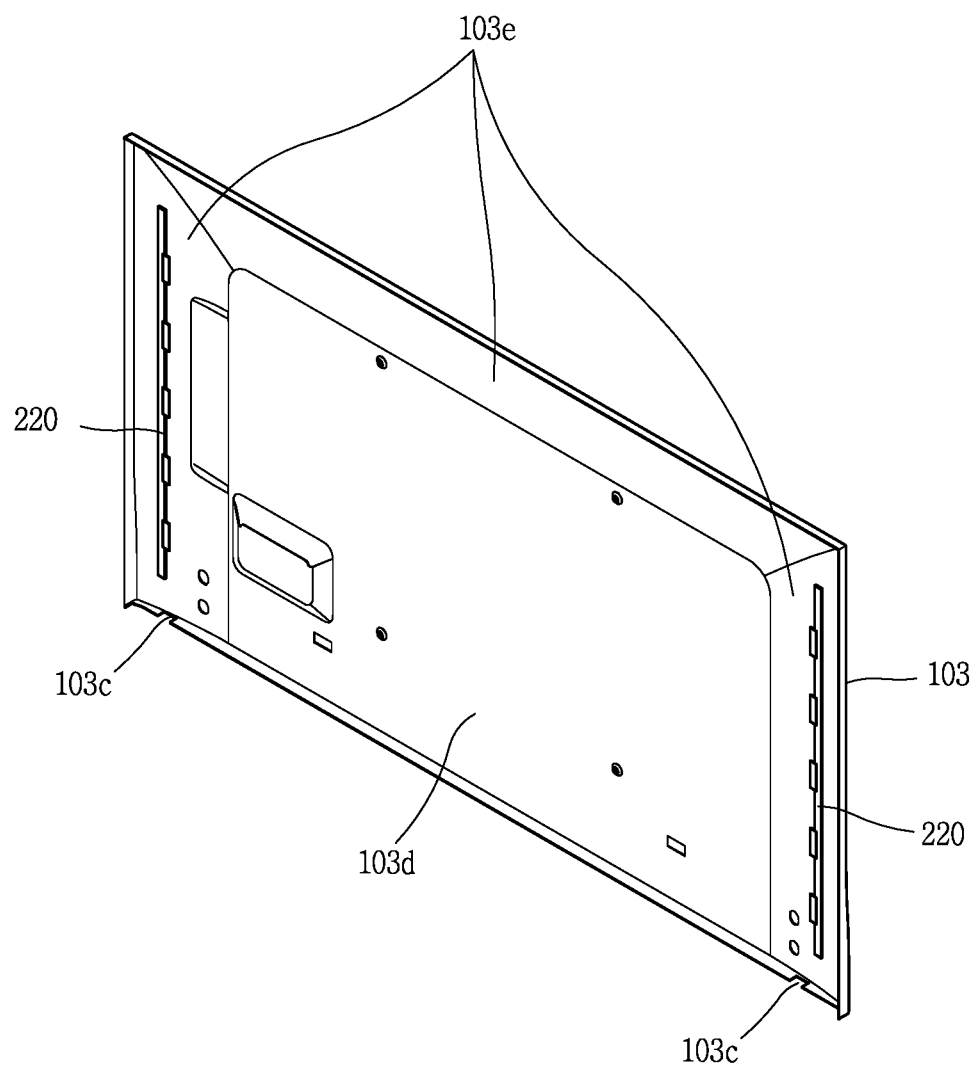
FIG. 6 is a perspective diagram of a rear surface of a rear case according to an embodiment of the present invention.
Figure 7:
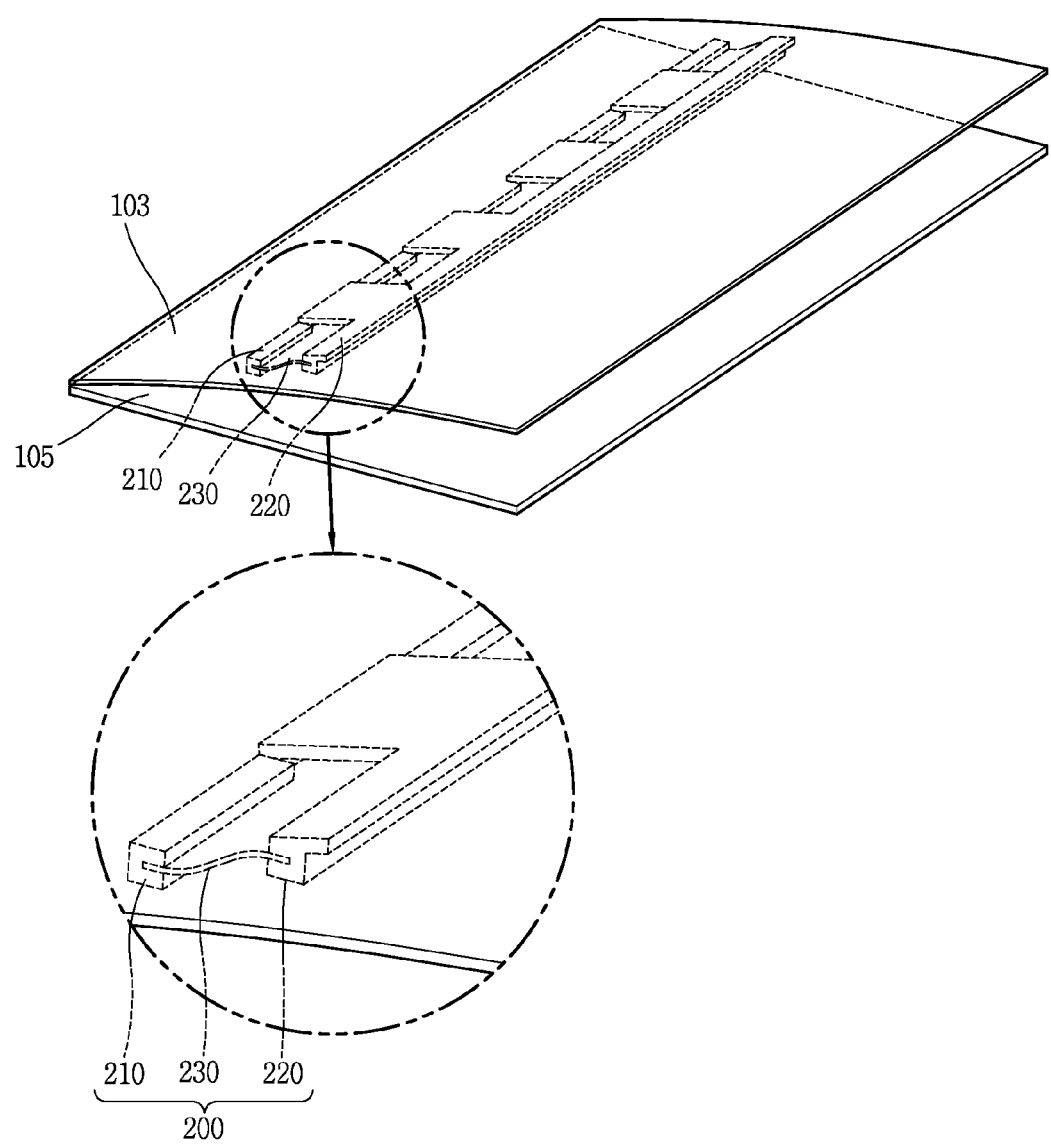
FIG. 7 is a diagram illustrating one example of a coupling module according to an embodiment of the present invention.
Figure 8:
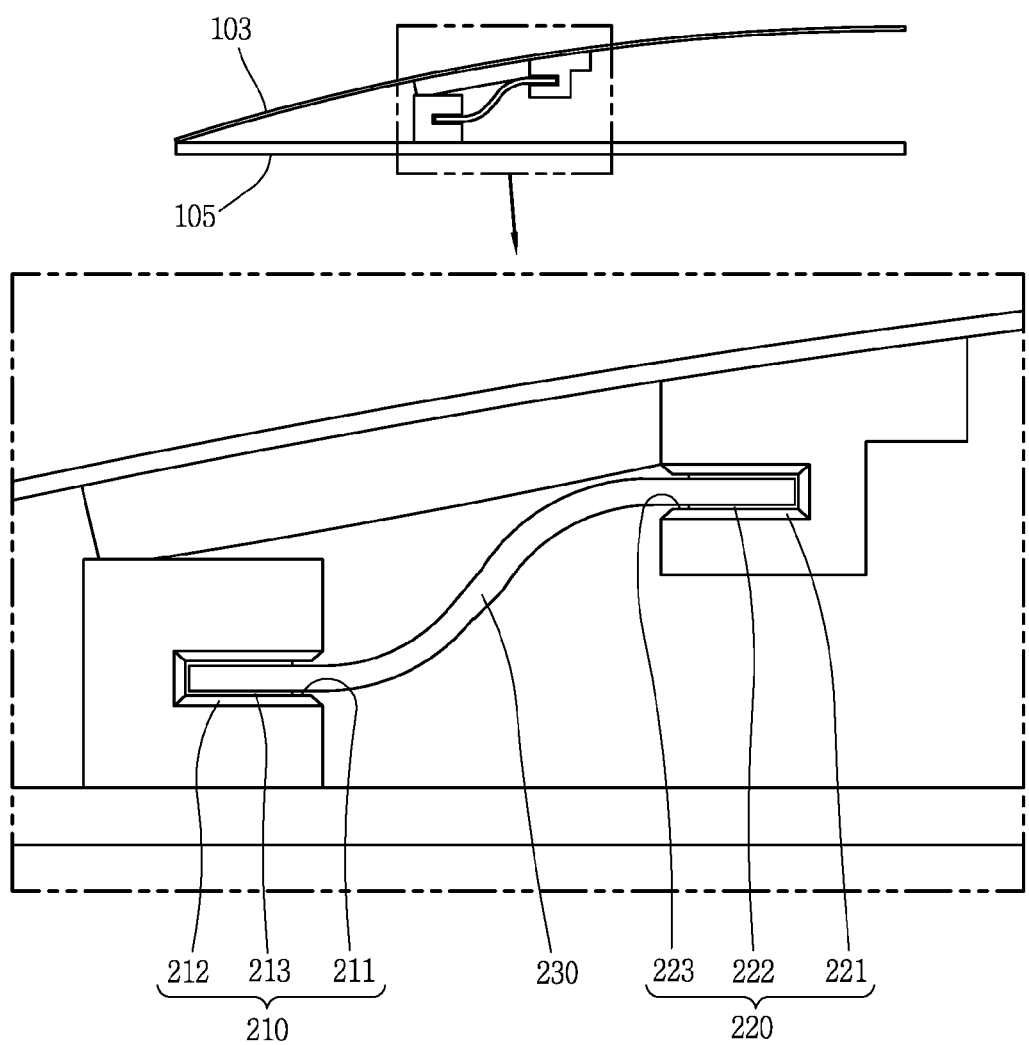
FIG. 8 is a diagram illustrating a state where a first case and a second case are coupled by the coupling module to each other.
Figure 9:
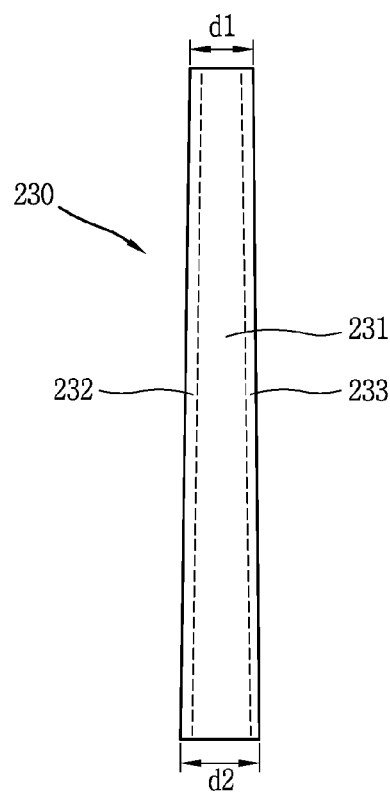
FIG. 9 is a diagram of a slide member.
Figure 10:
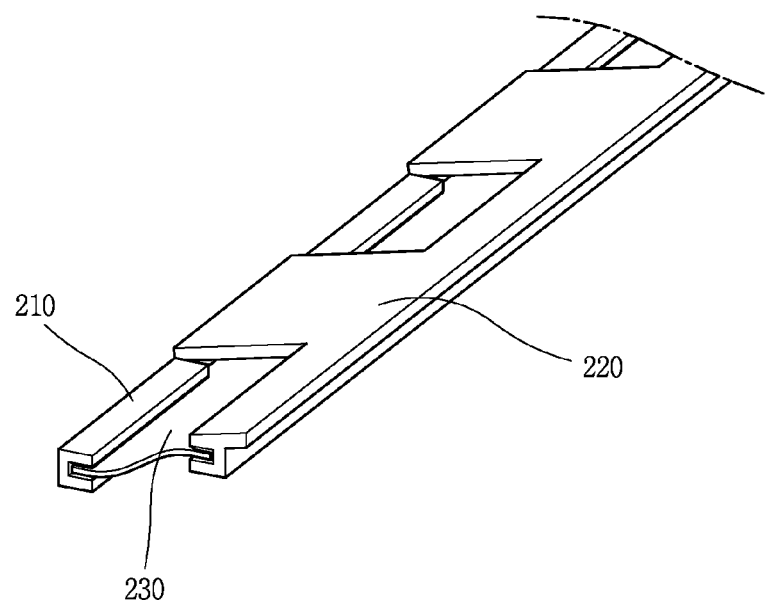
FIG. 10 is a diagram of the coupling module.
Figure 11:
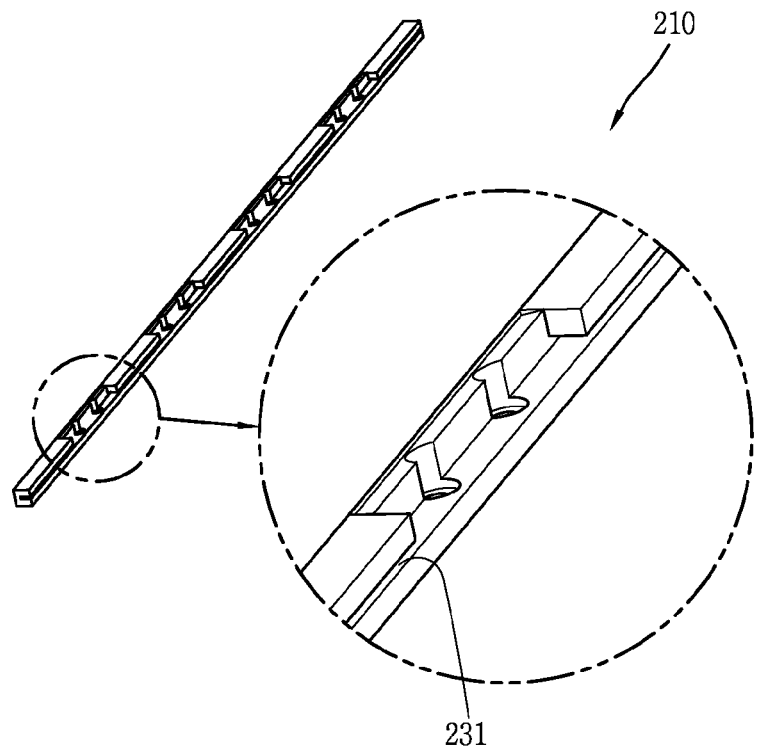
FIGS. 11 to 13 are diagrams illustrating first and second members, and the slide member, respectively, which are illustrated in FIG. 10.
Figure 12:
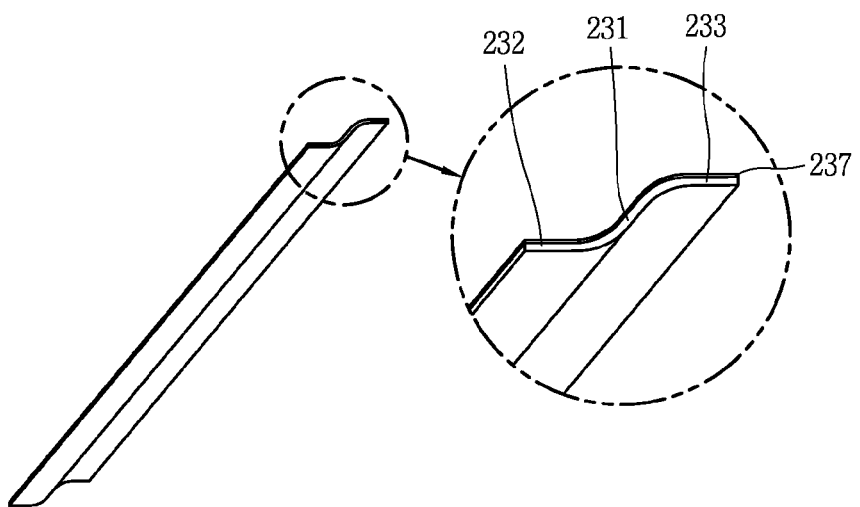
Figure 13:
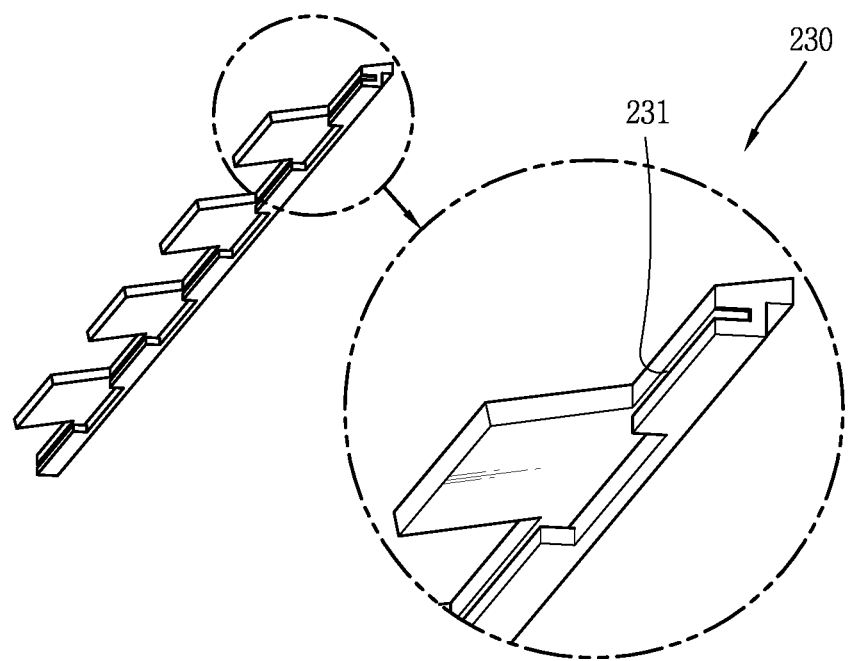

FIG. 6 is a perspective diagram of a rear surface of a rear case according to an embodiment of the present invention. FIG. 7 is a diagram illustrating one example of a coupling module according to an embodiment of the present invention. FIG. 8 is a diagram illustrating a state where a first case and a second case are coupled by the coupling module to each other. FIG. 9 is a diagram of a slide member. FIG. 10 is a diagram of the coupling module. FIGS. 11 to 13 are diagrams illustrating first and second members, and the slide member, respectively, which are illustrated in FIG. 10.

The image display device 100 includes the front case 102 that constitutes an external appearance, the middle case 105, and the rear case 103. The display unit 170 is supported by the middle case 105. Then, a coupling module 200 is used when any one of these cases is coupled to another one.

The rear case 103 according to the present invention includes a main surface 103d and a curved portion that is formed around a main surface 103d. The curved portion 103e is formed in such a manner as to have a constant curvature. In a case where the middle case 105 is defined as a first case 105 and the rear case 103 is a second case 103, the second case 103 is formed in such a manner that, as we go farther from the main surface 103d to edge portions, the second case 103 becomes closer to the first case 105 to which the second case 103 is to be coupled. The rear case 103 is formed in such a manner as to cover all portions of the rear surface of the image display device 100. Furthermore, the rear case 103 is formed in such a manner that, when viewed from the outside, the rear surface of the image display device 100 is smoothly curved from one end to the opposite end. In addition, the rear case 103 is formed in such a manner that a portion other than the main surface 103d is curved from one end to the opposite end.

As one example, the coupling module 200 is formed in such a manner that the middle case 105 and the rear case 103 are coupled to each other. For description, the middle case 105 and the rear case 103 are hereinafter referred to as the first case 105 and the second case 103, respectively. The first case 105 and the second case 103 are coupled to each other using screws. To do this, holes are formed in each of the first case 105 and the second case 103. In addition, grooves are formed in the case in order for the screws to protrude from the case. In this case, the holes and the grooves that are formed in the case have an influence on the external appearance of the image display device 100.

According to the present invention, the rear case 103 is formed in such a manner as to cover all portions of the rear surface of the image display device 100 and the rear case 103 is formed in such a manner that the rear case 103 is smoothly curved from one end to the opposite end. In this case, it is difficult to acquire a harmonious external appearance of the image display device 100 because of one or more holes that are formed in the rear case 103 in order to insert the screws.

Therefore, according to the present invention, the first and second cases 105 and 103 are coupled to each other, using the coupling module 200 as a way in which the first and second cases 105 and 103 are coupled to each other, using as few screws for coupling as possible or without using any screws.

As illustrated FIGS. 7 and 8, the coupling module 200 includes a slide member 230, and first and second members 210 and 220.

The first member 210 is formed on the rear surface of the first case 105, and the second member 220 is one surface of the second case 103. The one surface of the second case 103 is a surface that faces the rear surface of the first case 105.

The first and second members 210 and 220 are configured to have the form of a bar that extends lengthwise. Furthermore, the first and second member 210 and 220 are arranged in parallel with each other. The first and second members 210 and 220 have groove portions 211 and 221, respectively, into which the slide member 230 is inserted. As one example, a first groove portion 211 is formed in the first member 210, and a second groove portion 221 is formed in the second member 220.

The first and second members 210 and 220 are arranged the same plane. Alternatively, the first and second members 210 and 220 are arranged in such a manner as to have different heights. For example, the first member 210 is arranged in such a manner as to have a first height from the rear surface of the first case 105, and the second member 220 is arranged in such a manner as to have a second height from the rear surface of the first case 105.

The first member 210 and the second member 220 are coupled to the first and second cases 105 and 103, respectively. The first member 210 and the second member 220 may be integrally formed on the cases, respectively, through injection molding. Alternatively, the first member 210 and the second member 220 may be fixed to the cases, respectively, using screws, or may be attached to the cases, respectively, using an adhesive material such as a double-sided adhesive tape.

The second case 103 includes the opening portion 103c through which the slide member 230 comes in and goes out. The slide member 230 is inserted through the opening portion 103c from one end of each of the cases to the opposite end.

A chamfer portion 212 is formed in one surface of each of the members, which is adjacent to the opening portions 103c. The chamfer portion 212 is formed, in a chamfered manner, in the one surface of each of the members, in which the groove portions 211 and 221 are formed. That is, the chamfer portions 212 are portions that result from chamfering corners of the first and second groove portions 211 and 221. Thus, when the slide member 230 is inserted, interference with the first and second groove portions 211 and 221 is reduced and this makes it possible for the slide member 230 to be inserted into the groove members 211 and 221 in an easier manner.

The slide member 230 is formed in such a manner as to include first and second insertion portions 232 and 233 and a curved portion 231. The first and second insertion portions 232 and 233 are formed in both flank sides of the slide member 230, respectively, and are inserted into the first and second groove portions 211 and 221, respectively. The slide member 230 that is inserted into the first and second groove members 211 and 221 reciprocates along the first and second groove portions 211 and 221. That is, the slide member 230 is formed in such a manner that the flank sides of the slide member 230 are inserted into the first and second member 210 and 220 and the slide member 230 can be moved in a sliding way. When the flank sides of the slide member 230 are inserted into the first and second members 210 and 220 and the slide member 230 is moved in a sliding way in one direction, the first and second cases 105 and 103 are coupled to each other. Thus, the first and second cases 105 and 103 are coupled to each other without using screws.

The slide member 230 is configured to have the form of a thin plate. At this time, the first and second insertion portions 232 and 233 are the flank sides of the slide member 230, which have the shape of a thin plate. The curved portion 231 is a portion that couples the first and second insertion portions 232 and 233 to each other. The first and second members 210 and 220 are arranged in such a manner as to have different heights, and thus the curved portion 231 is formed to be "S"-shaped. Thus, both flank sides of the curved portion 231 are coupled to the first and second insertion portions 232 and 233, respectively, at different heights. In this manner, the curved portion 231 is configured in such a manner that both sides of the centerline of the curved portion 231 are curved.

The curved portion 231 sustains a force that is exerted on the slide member 230 both in the sideways direction and in the vertical direction with respect to the centerline. That is, because the slide member 230 is formed to have an "S"-shaped curved surface, the coupling of the first and second cases 105 and 103 is supported both in the sideways direction and the vertical direction.

The coupling module 200 includes the slide member 230 that includes the curved portion 231 in this manner, and thus a force of repulsion is provided to prevent the coupling module 200 from being bent by the force that is exerted on the first and second cases 105 and 103.

The slide member 230 is formed in such a manner that a width of the slide member 230 increases gradually. In a state where the first and second cases 105 and 103 face each other, the slide member 230 is inserted through the opening portion 103c from one end of each of the cases to the other end. Both flank sides of the slide member 230 are inserted into the first and second groove portions 211 and 221, respectively, and are moved along the first and second groove portions 211 and 221, in a sliding way, respectively. At this point, one portion of the slide member 230, which is adjacent to the opening portion 103c, has the greater width than the other portions. Thus, both flank sides of the slide member 230 are inserted into the groove portions 211 and 221, respectively, for the coupling of the first and second cases 105 and 103. In this manner, the slide member 230 is formed in such a manner that the width of the slide member 230 increases gradually, and thus both flank sides of the slide member 230 are brought into close contact with the groove portions 211 and 221, respectively.

A heat generation portion is arranged on the rear surface of the first case 105 in such a manner that the heat generation portion is exposed. The heat generation portion here is the heat dissipation member 179, the drive unit 155, or the power supply unit 190. In addition, the heat generation portion may be a portion that is heated to a predetermined temperature or above when the image display device operates, except for the heat dissipation member 179, the drive unit 155, and the power supply unit 190. The coupling module 200 is arranged adjacent to the heat generation portion. The coupling module 200 includes a heat conduction portion 237, and thus heat that is generated in the heat generation portion is discharged outside of the case.

The heat conduction portion is formed on any one of members that constitute the coupling module 200. As one example, one of the members is made of a heat conduction material, and the heat conduction portion 237 is formed on one surface of the one of the members. The heat conduction portion 237 is made up of heat conduction tapes. Alternatively, the heat conduction portion 237 is made of heat conduction epoxy, or the like. The heat conduction portion 237 is formed in such a manner as to include at least one among a heat dissipation plate, a heat dissipation sheet, a heat dissipation lubricant, a thermally conductive bonding agent, a heat dissipation gel, a heat dissipation paint, and a phase change material (PCM). A silicone-based or a carbon-based composite material is used for the heat dissipation plate and the heat dissipation sheet. Furthermore, a metal material with high thermal conductivity, such as copper, is used for the heat dissipation plate and the heat dissipation sheet.

The heat conduction portion 237 is formed in such a manner as to make contact with the heat generation portion. Then, the heat conduction portion 237 discharges heat that is generated in the heat generation portion, through the opening portion 103c. Furthermore, the heat conduction portion 237 may discharge heat that is generated in the heat generation portion, through a hole that is formed in the cases. Moreover, the heat conduction portion 237 may dissipate heat that is generated in the heat generation portion, to the cases, and then the heat may be discharged outside of the cases. In this case, at least one portion of the case, which is adjacent to the heat conduction portion 237, is made of a heat dissipation material in order to facilitate the heat dissipation.

Then, the heat conduction portion 237 extends from the heat generation portion to the opening portion 103c. In addition, the heat conduction portion 237 extends to a hole that is formed in the case, in such a manner that heat which is generated in the heat generation portion is discharged through the hole.

When the image display device 100 operates, slight vibration occurs due to operation of the display unit 170, the drive unit 155, or the power supply unit 190. The slight vibration generates a noise. In addition, in a case where the vibration propagates to the rear case 103 and the rear case 103 makes contact with an internal wall of a building, a noise is generated and at least one component that constitutes the image display device 100 is damaged. As one example, in the case where the rear case 103 makes contact with the internal wall of the building, a friction occurs between the rear case 103 and the other case, and thus a portion that couples the rear case 103 and the other case is damaged. To prevent this, the coupling module 200 includes a shock-absorbing member 213. As one example, the shock-absorbing member 213 is formed between the slide member 230 and the second member 220. In addition, the shock-absorbing member 213 may be formed between the slide member 230 and the first member 210. The shock-absorbing member 213 is made of elastic synthetic resin.

Figure 14:
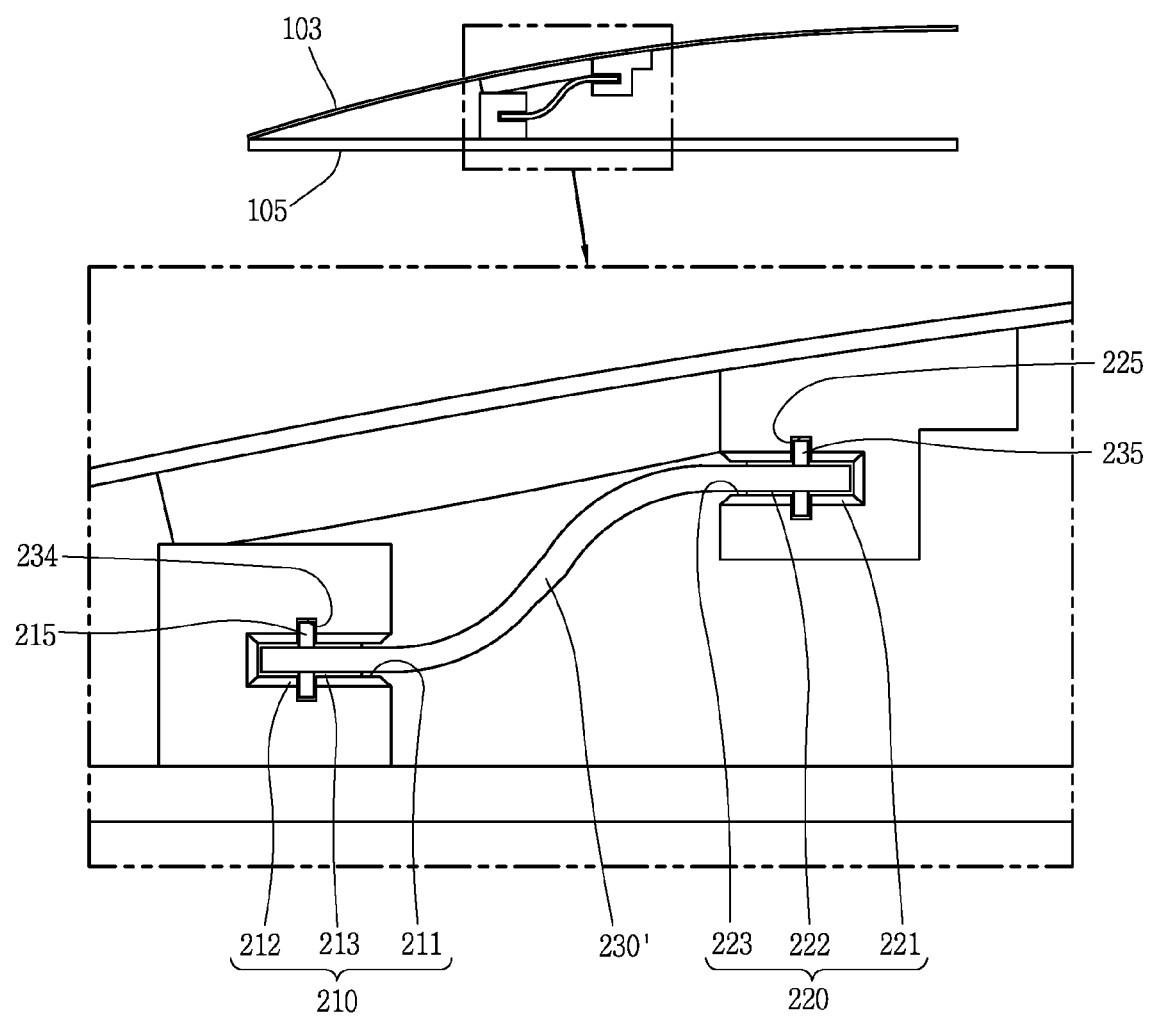
FIGS. 14 and 15 are diagrams illustrating one example of a coupling module according to another embodiment of the present invention.
Figure 15:
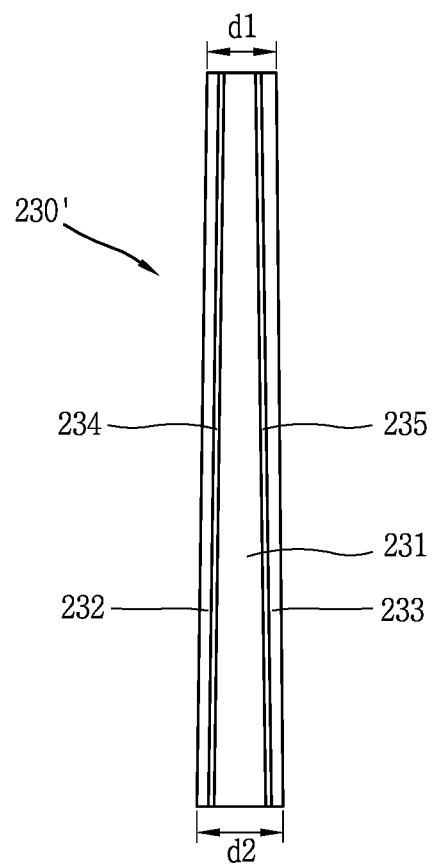

FIGS. 14 and 15 are diagrams illustrating one example of a coupling module 200 according to another embodiment of the present invention.

As illustrated in FIGS. 14 and 15, the coupling module 200 includes a slide member 230', and the first and second members 210 and 220. The first member 210 is formed on the rear surface of the first case 105, and the second member 220 is one surface of the second case 103. The one surface of the second case 103 is a surface that faces the rear surface of the first case 105.

The first and second members 210 and 220 are configured to have the form of a bar that extends lengthwise. Furthermore, the first and second member 210 and 220 are arranged in parallel with each other. In addition, the first and second members 210 and 220 include groove portions, respectively, in such a manner that the slide member 230' is inserted into the groove portions. As one example, a first groove portion is formed in the first member 210, and a second groove portion is formed in the second member 220.

The first member 210 and the second member 220 are coupled to the first and second cases 105 and 103, respectively. The first member 210 and the second member 220 may be integrally formed on the cases, respectively, through injection molding.

The slide member 230' is formed in such a manner as to include the first and second insertion portions 232 and 233 and the curved portion 231. The first and second insertion portions 232 and 233 are formed in both flank sides of the slide member 230', respectively, and are inserted into the groove portions 211 and 221, respectively. The slide member 230' that is inserted into the first and second groove members 211 and 221 reciprocates along the first and second groove portions 211 and 221. That is, the slide member 230' is formed in such a manner that the flank sides of the slide member 230 are inserted into the first and second member 210 and 220, respectively, and thus the slide member 230 can be moved in a sliding way.

The slide member 230' is configured to have the form of a thin plate. At this time, the first and second insertion portions 232 and 233 are the flank sides of the slide member 230, which have the shape of a thin plate. The curved portion 231 is a portion that couples the first and second insertion portions 232 and 233 to each other. The first and second members 210 and 220 are arranged in such a manner as to have different heights, and thus the curved portion 231 is formed to be "S"-shaped. Thus, both flank sides of the curved portion 231 are coupled to the first and second insertion portions 232 and 233, respectively, at different heights. In this manner, the curved portion 231 is configured in such a manner that both sides of the centerline of the curved portion 231 are curved.

The slide member 230' includes protrusions. That is, protrusions 234 and 235 that protrudes in a direction that intersects a direction in which the slide member 230' are inserted into the first and second members 210 and 220 are formed on the first and second insertion portions 232 and 233, respectively.

Guide portions 215 and 225 are formed in the first and second members 210 and 220, respectively, which are counterparts of the slide member 230'.

The coupling module 200 that includes the protrusions and the guide portions in this manner, and thus a support force of the slide member 230' that sustains a force which is exerted in the sideways direction and the vertical direction is further increased.

Figure 16:
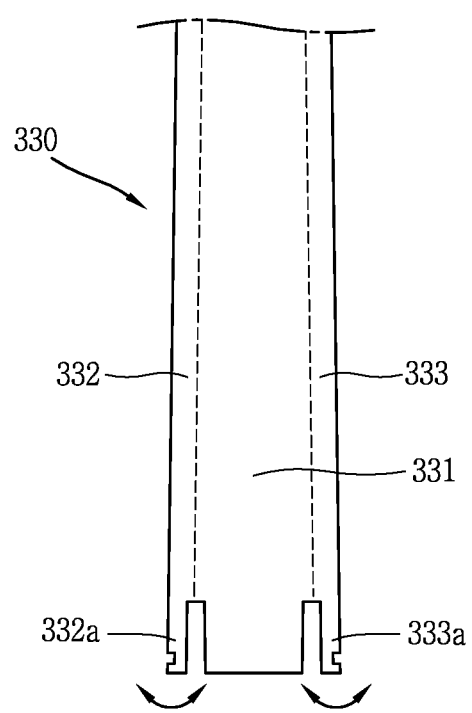
FIG. 16 is a diagram illustrating a slide member that is another example of the slide member.

FIG. 16 is a diagram illustrating a slide member 330 that is another example of the slide member.

The slide member 330 is formed in such a manner as to include first and second insertion portions 332 and 333 and a curved portion 331. The first and second insertion portions 332 and 333 are formed in both flank sides of the slide member 330, respectively, and are inserted into the groove portions 211 and 221, respectively. The slide member 330 that is inserted into the first and second groove members 211 and 221 reciprocates along the first and second groove portions 211 and 221.

The slide member 330 is configured to have the form of a thin plate. At this time, the first and second insertion portions 332 and 333 are the flank sides of the slide member 330, which have the shape of a thin plate. The curved portion 331 is a portion that couples the first and second insertion portions 332 and 333 to each other. The first and second members 310 and 320 are arranged in such a manner as to have different heights, and thus the curved portion 331 is formed to be "S"-shaped. Thus, both flank sides of the curved portion 331 are coupled to the first and second insertion portions 232 and 233, respectively, at different heights. In this manner, the curved portion 331 is configured in such a manner that both sides of the centerline of the curved portion 331 are curved.

The curved portion 331 sustains a force that is exerted on the slide member 330 both in the sideways direction and in the vertical direction with respect to the centerline. That is, because the slide member 330 is formed to have an "S"-shaped curved surface, the coupling of the first and second cases 105 and 103 is supported both in the sideways direction and the vertical direction.

The coupling module 300 includes the slide member 330 that includes the curved portion 331 in this manner, and thus a force of repulsion is provided to prevent the coupling module 300 from being bent by the force that is exerted on the first and second cases 105 and 103.

A fixation portions 332a or 333a that is elastically transformed and thus is coupled to at least one among the first and second members 310 and 320 is formed in a lower portion of the slide member 330. In a state where the first and second cases 105 and 103 are brought into contact with each other, the slide member 330 is inserted through the opening portion 103c from one end of each of the cases to the other end. Both flank sides of the slide member 330 are inserted into the first and second groove portions 211 and 221, respectively, and are moved along the first and second groove portions 211 and 221, in a sliding way, respectively. After the slide member 330 is inserted to some extent, the fixation portions 332a and 333a are elastically transformed, and thus are coupled to the first and second member 310 and 320, respectively. The fixation portions 332a and 333a have the form of a cantilever. The fixation 332a is formed in such a manner that one end portion of the fixation 332a is connected to the first insertion portion 332 and the other end portion is elastically transformed. The fixation 333a is formed in such a manner that one end portion of the fixation 333a is connected to the second insertion portion 333 and the other end portion is elastically transformed. The user can transform the fixation portions 332a and 333a inward. Thus, the user can couple the fixation portions 332a and 333a to the first and second members 310 and 320, respectively, or can release the coupling of the fixation portions 332a and 333a to the first and second members 310 and 320, respectively.

Then, the first and second members 310 and 320 are formed in such a manner that the first and second members 310 and 320 correspond to the shapes of the fixation portions 332a and 333a, respectively. For example, when the fixation portions 332a and 333a includes grooves, respectively, protrusions that correspond to the grooves are formed on the first and second members 310 and 320, respectively.

The various embodiments are described above in order to describe original technological ideas associated with various aspects of the present invention. However, one or more distinctive features of one embodiment can also be applied to one or more different embodiments. Some of the constituent elements or the steps according to each of the embodiments, which are described referring to drawings, can be modified or adjusted. The constituent elements and/or steps can be removed or be changed in position, and additional constituents and/or steps can be included in each of the embodiments.

The various distinctive features and technological idea, which are described above, can be realized in the form of software, hardware, firmware, middleware, or a combination of two or more of these. For example, a program for realizing a method of receiving a stereoscopic video signal in digital broadcast and for realizing an apparatus for receiving the stereoscopic image signal, which is stored in a computer-readable medium (which is executed by a computer, a processor, a controller, or the like), includes one or more program code sections that perform various tasks. Similarly, a software tool (which is executed by a computer, a process, a controller, or the like) for realizing the method of receiving the stereoscopic image signal in the digital broadcast and the device for receiving the stereoscopic image signal, which is stored in a computer-readable medium, includes some of program codes that perform various tasks.

The technical features of the present invention that are disclosed can apply to an image display device.

It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

The invention claimed is:

1. An image display device comprising:
    a first case that is formed to support a display unit;
    a second case that is formed to cover a rear surface of the first case; and
    a coupling module that couples the first case and the second case to each other,
    wherein the coupling module includes
    a first member that is formed on the rear surface and has a predetermined length,
    a second member that is formed on one surface of the second case that faces the rear surface and is formed in parallel with the first member, and
    a slide member that is formed in such a manner that the slide member is inserted and is able to be moved in a sliding way, and
    wherein the second case is formed in such a manner as to cover all portions of a rear surface of the image display device.

2. The image display device of claim 1, wherein the first and second members are arranged on the first and second cases, respectively, in such a manner as to have different heights from the rear surface.

3. The image display device of claim 2, wherein the slide member includes
    first and second insertion portions that are inserted into the first and second members, respectively, and
    a curved portion that is formed to couple the first and second insertion portions that are inserted in the first and second members, respectively, at different height.

4. The image display device of claim 3, wherein protrusions that protrude in a direction that intersects a direction in which the first and second insertion portions are inserted on the first and second members, respectively, and
    wherein the first and second members have guide portions that correspond to the protrusions, respectively.

5. The image display device of claim 4, wherein a width of the slide member increases gradually.

6. The image display device of claim 1, wherein a fixation portion that is elastically transformed and is coupled to at least one among the first and second members is formed on a lower portion of the slide member.

7. The image display device of claim 1, wherein the second case includes an opening portion that is formed in a state where the slide member comes in and goes out through the opening portion, in order to fix the first and second cases by moving the slide member from one end of each of the first and second cases to the opposite end in a state where the first and second cases are brought to come into contact with each other.

8. The image display device of claim 7, wherein a heat generation portion is exposed to the outside on a rear surface of the first case, and
    wherein the coupling module is arranged adjacent to the heat generation portion.

9. The image display device of claim 8, wherein the coupling module includes a heat conduction portion, and
    wherein the heat conduction portion extends from the heat generation portion to the opening portion.

10. The image display device of claim 7, wherein a chamfer portion is formed on one surface of each of the first and second members, which is adjacent to the opening portion.

11. The image display device of claim 10, wherein the second case is formed to be curved to a predetermined curvature, in such a manner that, as the second case goes farther from a main surface to edge portions, a distance to the first case becomes shorter.

12. The image display device of claim 1, wherein a shock-absorbing member is formed between the slide member and the second member in order to prevent vibration from propagating from the first case.

13. An image display device comprising:
    a first case;
    a second case; and
    a coupling module that couples the first and second cases to each other,
    wherein the coupling module includes first and second members that are formed on surfaces of the first and second cases, respectively, which face each other, in order to fix the first and second cases by moving a slide member from one end of each of the first and second cases to the opposite end in a state where the first and second cases are brought to come into contact with each other, and
    wherein a width of the slide member increases gradually.

14. The image display device of claim 13, wherein the first member includes a first groove portion that is formed to have a predetermined length,
    wherein the second member includes a second groove portion that is formed in parallel with the first groove portion, and
    wherein both groove portions flank sides of the slide member are inserted into the first and second groove portions, respectively, and thus the slide member is moved along the first and second groove portions.

15. The image display device of claim 14, wherein the first and second members are arranged on the first and second cases, respectively, in such a manner as to have different heights from a rear surface of the first case.

16. The image display device of claim 15, wherein the slide member includes
    first and second insertion portions that are inserted in the first and second members, respectively, and
    a curved portion that is formed to couple the first and second insertion portions that are inserted in the first and second members, respectively, at a different height.

17. The image display device of claim 16, wherein protrusions that protrude in a direction that intersects a direction in which the first and second insertion portions are formed on the first and second members, respectively, and
    wherein the first and second members have guide portions that correspond to the protrusions, respectively.

18. The image display device of claim 13, wherein a fixation portion that is elastically transformed and is coupled to at least one among the first and second members is formed on a lower portion of the slide member.

* * * * *